US011165043B2

(12) United States Patent
Kishimoto

(10) Patent No.: US 11,165,043 B2
(45) Date of Patent: *Nov. 2, 2021

(54) ORGANIC ELECTROLUMINESCENT DISPLAY DEVICE AND METHOD FOR PRODUCING SAME

(71) Applicant: SAKAI DISPLAY PRODUCTS CORPORATION, Sakai (JP)

(72) Inventor: Katsuhiko Kishimoto, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/896,706

(22) Filed: Jun. 9, 2020

(65) Prior Publication Data
US 2020/0365828 A1  Nov. 19, 2020

Related U.S. Application Data

(63) Continuation of application No. 16/468,415, filed as application No. PCT/JP2017/003481 on Jan. 31, 2017, now Pat. No. 10,720,603.

(51) Int. Cl.
*H01L 51/52* (2006.01)
*H01L 27/32* (2006.01)
*H01L 51/00* (2006.01)

(52) U.S. Cl.
CPC ...... *H01L 51/5253* (2013.01); *H01L 27/3276* (2013.01); *H01L 51/0097* (2013.01); *H01L 2227/323* (2013.01)

(58) Field of Classification Search
CPC ............ H01L 51/5253; H01L 51/0097; H01L 27/3276
See application file for complete search history.

(56) References Cited

U.S. PATENT DOCUMENTS 9,991,326 B2    6/2018 Iijima et al.
10,720,603 B2 *  7/2020 Kishimoto ............ H05B 33/04
(Continued)

FOREIGN PATENT DOCUMENTS

JP    2005-100685 A    4/2005
JP    2009-158940 A    7/2009
(Continued)

OTHER PUBLICATIONS

Notice of Allowance and Fee(s) Due dated Apr. 21, 2020 for U.S. Appl. No. 16/468,415.

*Primary Examiner* — Nathan W Ha
(74) *Attorney, Agent, or Firm* — ScienBiziP, P.C.

(57) ABSTRACT

A thin film encapsulation structure included in an organic electroluminescent display device includes a first inorganic barrier layer, an organic barrier layer, and a second inorganic barrier layer. The thin film encapsulation structure is formed on an active region and an active region side portion of lead wires. Each lead wire at least partially includes, at least on lowermost portions of two side surfaces thereof in contact with the first inorganic barrier layer, a forward tapering side surface portion having a tapering angle smaller than 90 degrees in a cross-section parallel to a line width direction thereof. The thin film encapsulation structure further includes an inorganic barrier layer joint portion. On portions of the lead wires having the forward tapering side surface portions, the inorganic barrier layer joint portion is formed and the active region is completely enclosed by the inorganic barrier layer joint portion.

17 Claims, 12 Drawing Sheets

(56) References Cited

U.S. PATENT DOCUMENTS

| | | |
|---|---|---|
| 2003/0071569 A1 | 4/2003 | Chung et al. |
| 2008/0238303 A1* | 10/2008 | Lee .................... H01L 51/5246 |
| | | 313/504 |
| 2008/0278070 A1* | 11/2008 | Kim .................... H01L 27/323 |
| | | 313/504 |
| 2008/0297042 A1* | 12/2008 | Ahn .................... H01L 51/525 |
| | | 313/504 |
| 2009/0140438 A1 | 6/2009 | Yamazaki et al. |
| 2011/0084290 A1 | 4/2011 | Nakamura et al. |
| 2013/0084667 A1* | 4/2013 | Otsuka ................ H01L 51/0018 |
| | | 438/46 |
| 2013/0126915 A1* | 5/2013 | Chan .................. H01L 51/5256 |
| | | 257/88 |
| 2013/0171902 A1 | 7/2013 | Wang et al. |
| 2014/0183470 A1 | 7/2014 | Kim |
| 2015/0060822 A1 | 3/2015 | Kamiya et al. |
| 2016/0043151 A1 | 2/2016 | Kato |
| 2016/0043346 A1 | 2/2016 | Kamiya et al. |
| 2016/0126495 A1 | 5/2016 | Oka et al. |

FOREIGN PATENT DOCUMENTS

| | | |
|---|---|---|
| JP | 2012-099290 A | 5/2012 |
| JP | 2013-186971 A | 9/2013 |
| JP | 2015-050022 A | 3/2015 |
| JP | 2015-176717 A | 10/2015 |
| JP | 2016-039070 A | 3/2016 |
| JP | 2016-039120 A | 3/2016 |
| KR | 10-2014-0087499 A | 7/2014 |
| WO | 2014/196137 A1 | 12/2014 |

\* cited by examiner

ORGANIC ELECTROLUMINESCENT DISPLAY DEVICE AND METHOD FOR PRODUCING SAME

TECHNICAL FIELD

The present invention relates to an organic EL display device, specifically, to a flexible organic EL display device, and a method for producing the same.

BACKGROUND ART

Organic EL (Electroluminescent) display devices start being put into practical use. One feature of an organic EL display device is flexibility thereof. Such an organic EL display device includes, in each of pixels, at least one organic EL element (Organic Light Emitting Diode: OLED) and at least one TFT (Thin Film Transistor) controlling an electric current to be supplied to the at least one OLED. Hereinafter, an organic EL display device will be referred to as an "OLED display device". Such an OLED display device including a switching element such as a TFT or the like in each of OLEDs is called an "active matrix OLED display device". A substrate including the TFTs and the OLEDs will be referred to as an "element substrate".

An OLED (especially, an organic light emitting layer and a cathode electrode material) is easily influenced by moisture to be deteriorated and to cause display unevenness. One technology developed to provide an encapsulation structure that protects the OLED against moisture while not spoiling the flexibility of the OLED display device is a thin film encapsulation (TFE) technology. According to the thin film encapsulation technology, an inorganic barrier layer and an organic barrier layer are stacked alternately to allow such thin films to provide a sufficient level of water vapor barrier property. From the point of view of the moisture-resistance reliability of the OLED display device, such a thin film encapsulation structure is typically required to have a WVTR (Water Vapor Transmission Rate) lower than, or equal to, $1\times10^{-4}$ g/m$^2$/day.

A thin film encapsulation structure used in OLED display devices commercially available currently includes an organic barrier layer (polymer barrier layer) having a thickness of about 5 µm to about 20 µm. Such a relatively thick organic barrier layer also has a role of flattening a surface of the element substrate. However, such a thick organic barrier layer involves a problem that the bendability of the OLED display device is limited.

There is also a problem that the mass-productivity is low. The relatively thick organic barrier layer described above is formed by use of a printing technology such as an inkjet method, a microjet method or the like. By contrast, an inorganic barrier layer is formed by a thin film formation technology in a vacuum atmosphere (e.g., lower than, or equal to, 1 Pa). The formation of the organic barrier layer by use of a printing method is performed in the air or a nitrogen atmosphere, whereas the formation of the inorganic barrier layer is performed in vacuum. Therefore, the element substrate is put into, and out of, a vacuum chamber during the formation of the thin film encapsulation structure, which decreases the mass-productivity.

Under such a situation, as disclosed in, for example, Patent Document No. 1, a film formation device capable of producing an inorganic barrier layer and an organic barrier layer continuously has been developed.

Patent Document No. 2 discloses a thin film encapsulation structure including a first inorganic material layer, a first resin member and a second inorganic material layer provided on the element substrate in this order, with the first inorganic barrier layer being closest to the element substrate. In this thin film encapsulation structure, the first resin member is present locally, more specifically, in the vicinity of a protruding portion of the first inorganic material layer (first inorganic material layer covering the protruding portion). According to Patent Document No. 2, since the first resin member is present locally, more specifically, in the vicinity of the protruding portion, which may not be sufficiently covered with the first inorganic material layer, entrance of moisture or oxygen via the non-covered portion is suppressed. In addition, the first resin member acts as an underlying layer for the second inorganic material layer. Therefore, the second inorganic material layer is properly formed and properly covers a side surface of the first inorganic material layer with an expected thickness. The first resin member is formed as follows. An organic material heated and gasified to be mist-like is supplied onto an element substrate maintained at a temperature lower than, or equal to, room temperature. The organic material is condensed and put into liquid drops on the substrate. The organic material in the liquid drops moves on the substrate by a capillary action or a surface tension to be present locally, more specifically, at a border between a side surface of the protruding portion of the first inorganic barrier layer and a surface of the substrate. Then, the organic material is cured to form the first resin member at the border. Patent Document No. 3 also discloses an OLED display device including a similar thin film encapsulation structure.

CITATION LIST

Patent Literature

Patent Document No. 1: Japanese Laid-Open Patent Publication No. 2013-186971
Patent Document No. 2: WO2014/196137
Patent Document No. 3: Japanese Laid-Open Patent

SUMMARY OF INVENTION

Technical Problem

The thin film encapsulation structure described in each of Patent Documents Nos. 2 and 3 does not include a thick organic barrier layer, and therefore, is considered to improve the bendability of the OLED display device. In addition, since the inorganic barrier layer and the organic barrier layer may be formed continuously, the mass-productivity is also improved.

However, according to the studies made by the present inventor, an organic barrier layer formed by the method described in Patent Document No. 2 or 3 has a problem of not providing a sufficiently high level of moisture-resistance reliability.

In the case where an organic barrier layer is formed by use of a printing method such as an inkjet method or the like, it is possible to form the organic barrier layer only in an active region on the element substrate (the active region may also be referred to as an "element formation region" or a "display region") but not in a region other than the active region. In this case, in the vicinity of the active region (outer to the active region), there is a region where the first inorganic material layer and the second inorganic material layer are in direct contact with each other, and the organic barrier layer is fully enclosed by the first inorganic material layer and the second inorganic material layer and is insulated from the outside of the first inorganic material layer and the second inorganic material layer.

By contrast, according to the method for forming the organic barrier layer described in Patent Document No. 2 or 3, a resin (organic resin) is supplied to the entire surface of the element substrate, and the surface tension of the liquid-like resin is used to locate the resin locally, more specifically, at the border between the surface of the element substrate and the side surface of the protruding portion on the surface of the element substrate. Therefore, the organic barrier layer may also be undesirably formed in a region other than the active region (the region other than the active region may also be referred to as a "peripheral region"), namely, a terminal region where a plurality of terminals are located and a lead wire region where lead wires extending from the active region to the terminal region are formed. Specifically, the resin is present locally, more specifically, at, for example, the border between side surfaces of the lead wires or side surfaces of the terminals and the surface of the substrate. In this case, an end of the organic barrier layer formed along the lead wires is not enclosed by the first inorganic barrier layer and the second inorganic barrier layer, but is exposed to the air (ambient atmosphere).

The organic barrier layer is lower in the water vapor barrier property than the inorganic barrier layer. Therefore, the organic barrier layer formed along the lead wires acts as a route that leads the water vapor in the air to the active region.

The present invention, made to solve the above-described problem, has an object of providing an organic EL display device that includes a thin film encapsulation structure including a relatively thin organic barrier layer and is improved in the mass-productivity and the moisture-resistance reliability, and a method for producing the same.

Solution to Problem

An organic EL display device according to an embodiment of the present invention includes a flexible substrate; a plurality of TFTs formed on the flexible substrate; a plurality of gate bus lines and a plurality of source bus lines each connected with any of the plurality of TFTs; a plurality of organic EL elements each connected with any of the plurality of TFTs; a plurality of terminals located in a peripheral region outer to an active region in which the plurality of organic EL elements are located; a plurality of lead wires each connecting either one of the plurality of terminals and either one of the plurality of gate bus lines or either one of the plurality of source bus lines; and a thin film encapsulation structure formed on the plurality of organic EL elements and on portions of the plurality of lead wires, the portions being closer to the active region. The thin film encapsulation structure includes a first inorganic barrier layer, an organic barrier layer in contact with the first inorganic barrier layer, and a second inorganic barrier layer in contact with the organic barrier layer. At least a portion of each of the plurality of lead wires includes, at least on a lowermost portion of each of two side surfaces thereof in contact with the first inorganic barrier layer, a forward tapering side surface portion having a tapering angle smaller than 90 degrees in a cross-section parallel to a line width direction thereof. On the portion of each of the plurality of lead wires that includes the forward tapering side surface portion, the organic barrier layer is not present and the first inorganic barrier and the second inorganic barrier are in direct contact with each other.

In an embodiment, the plurality of terminals each include a forward tapering side surface portion having a tapering angle smaller than 90 degrees at least on a lowermost portion of each of all exposed side surfaces thereof.

In an embodiment, the forward tapering side surface portion has a tapering angle smaller than, or equal to, 85 degrees.

In an embodiment, the forward tapering side surface portion has a length longer than, or equal to, 50 nm in a direction normal to the flexible substrate.

In an embodiment, the portion of each of the plurality of lead wires on which the organic barrier layer is not present and the first inorganic barrier layer and the second inorganic barrier layer are in direct contact with each other has a length of at least 0.01 mm.

In an embodiment, the plurality of gate bus lines and the plurality of source bus lines each have side surfaces each having a tapering angle exceeding 85 degrees in a cross-section parallel to a line width direction thereof.

In an embodiment, the organic barrier layer is not substantially present on a flat portion.

In an embodiment, the organic barrier layer includes an opening on a flat portion, and a portion of the organic barrier layer that is present on the flat portion has an area size larger than an area size of the opening.

In an embodiment, an underlying surface for the organic barrier layer includes a bank substantially enclosing the active region. The bank includes, at least on a lowermost portion of each of two side surfaces thereof in contact with the first inorganic barrier layer, a forward tapering side surface portion having a tapering angle smaller than 90 degrees in a cross-section parallel to a line width direction thereof. A portion of each of the lead wires that is on the bank includes the forward tapering side surface portion. On the bank, the organic barrier layer is not present and the first inorganic barrier layer and the second inorganic barrier layer are in direct contact with each other.

A method for producing an organic EL display device according to an embodiment of the present invention is a method for producing any of the above-described organic EL display devices. The method includes step A of forming the first inorganic barrier layer selectively on the active region of the flexible substrate, the plurality of organic EL elements being formed in the active region; a step, after the step A, of locating the flexible substrate in a chamber and supplying a vapor-like or mist-like photocurable resin into the chamber; step B of condensing the photocurable resin on the first inorganic barrier layer such that the photocurable resin is not present on the portion of each of the lead wires that includes the forward tapering side surface portion; and a step, after the step B, of irradiating the condensed photocurable resin with light to form the organic barrier layer of a photocured resin.

A method for producing an organic EL display device according to another embodiment of the present invention is a method for producing any of the above-described organic EL display devices. The method includes step A of forming the first inorganic barrier layer selectively on the active region of the flexible substrate, the plurality of organic EL elements being formed in the active region; a step, after the step A, of locating the flexible substrate in a chamber and supplying a vapor-like or mist-like photocurable resin into the chamber; a step of condensing the photocurable resin on the first inorganic barrier layer to form a liquid-like film; a step of irradiating the liquid-like film of the photocurable resin with light to form a photocured resin layer; and a step of partially ashing the photocured resin layer to form the organic barrier layer.

A method for producing an organic EL display device according to an embodiment further includes a step of forming the plurality of gate bus lines, the plurality of source bus lines, the plurality of lead wires, and the plurality of terminals by a dry etching process.

In an embodiment, the step of forming the plurality of lead wires includes a step of forming the portion including the forward tapering side surface portion by a photolithography step using a multi-gray scale mask.

In an embodiment, the photocurable resin contains a vinyl group-containing monomer. It is preferred that the vinyl group-containing monomer contains an acrylic monomer. The photocurable resin may be a silicone resin.

An organic EL display device according to an embodiment of the present invention includes an organic EL element formed on a flexible substrate and a thin film encapsulation structure formed on the organic EL element. The thin film encapsulation structure includes a first inorganic barrier layer, an organic barrier layer in contact with the first inorganic barrier layer, and a second inorganic barrier in contact with the organic barrier layer. The organic barrier layer is present on at least a part of a flat portion, and a surface of the organic barrier layer is oxidized. Herein, the "flat portion" refers to a flat portion of a surface of the organic EL element on which the thin film encapsulation structure is formed, more specifically, a lowest portion of the portion. It should be noted that a portion in which a particle (microscopic dust particle) is attached to the surface of the organic EL element is excluded.

In an embodiment, the organic barrier layer includes an opening on the flat portion, and the portion of the organic barrier layer that is present on the flat portion has an area size larger than an area size of the opening. Namely, the area size of the portion on the flat portion where the organic barrier layer is present (such a portion may be referred to as a "solid portion") is larger than the area size of the opening. The area size of the solid portion is 50% or greater of the area size of the organic barrier layer (including the solid portion and the opening) on the flat portion, namely, 50% of the area size of the photocurable resin layer on the flat portion. It is preferred that the area size of the solid portion is 80% or greater of the area size of the photocurable resin layer on the flat portion. It is more preferred that the area size of the solid portion is 80% or greater and 90% or less of the area size of the photocurable resin layer on the flat portion. The organic barrier layer on the flat portion does not need to include an opening.

In an embodiment, the organic barrier layer present on the flat portion has a thickness of 10 nm or greater.

In an embodiment, the organic barrier layer present on the flat portion has a maximum thickness less than 200 nm.

In an embodiment, the first inorganic barrier layer and the second inorganic barrier layer are each an SiN layer having a thickness of 200 nm or greater and 1000 nm or less. The SiN layer has a film stress having an absolute value of preferably 100 MPa or smaller, more preferably, 50 MPa or smaller. It is preferred that the film formation temperature of the SiN layer is 90° C. or lower.

A method for producing an organic EL display device according to an embodiment of the present invention is a method for producing any of the above-described organic EL display devices. The method includes the steps of preparing, in a chamber, an organic EL element having the first inorganic barrier layer formed thereon; supplying a vapor-like or mist-like photocurable resin into the chamber; condensing the photocurable resin on the first inorganic barrier layer to form a liquid-like film; irradiating the liquid-like film of the photocurable resin with light to form a photocured resin layer; and partially ashing the photocured resin layer to form the organic barrier layer.

In an embodiment, the method includes the step of performing ashing such that more than 50% of the photocured resin layer formed on the flat portion is left. The ashing is performed by plasma ashing using at least one type of gas among $N_2O$, $O_2$ and $O_3$.

Advantageous Effects of Invention

An embodiment of the present invention provides an organic EL display device that includes a thin film encapsulation structure including a relatively thin organic barrier layer and is improved in the mass-productivity and the moisture-resistance reliability, and a method for producing the same.

BRIEF DESCRIPTION OF DRAWINGS

FIG. 3(a) is a cross-sectional view taken along line 3A-3A' in FIG. 2, FIG. 3(b) is a cross-sectional view taken along line 3B-3B' in FIG. 2, FIG. 3(c) is a cross-sectional view taken along line 3C-3C' in FIG. 2, FIG. 3(d) is a cross-sectional view taken along line 3D-3D' in FIG. 2, and FIG. 3(e) is a cross-sectional view taken along line 3E-3E' in FIG. 2.

FIG. 8(a) is a cross-sectional view of a portion including a particle P, and FIG. 8(b) is a cross-sectional view of a portion including a bank 3DB formed on an underlying surface for an organic barrier layer 14D (e.g., surface of the OLED 3) to substantially enclose an active region.

DESCRIPTION OF EMBODIMENTS

Hereinafter, an OLED display device and a method for producing the same according to embodiments of the present invention will be described with reference to the drawings. The embodiments of the present invention are not limited to the embodiments that are described below as examples.

Figure 1A:
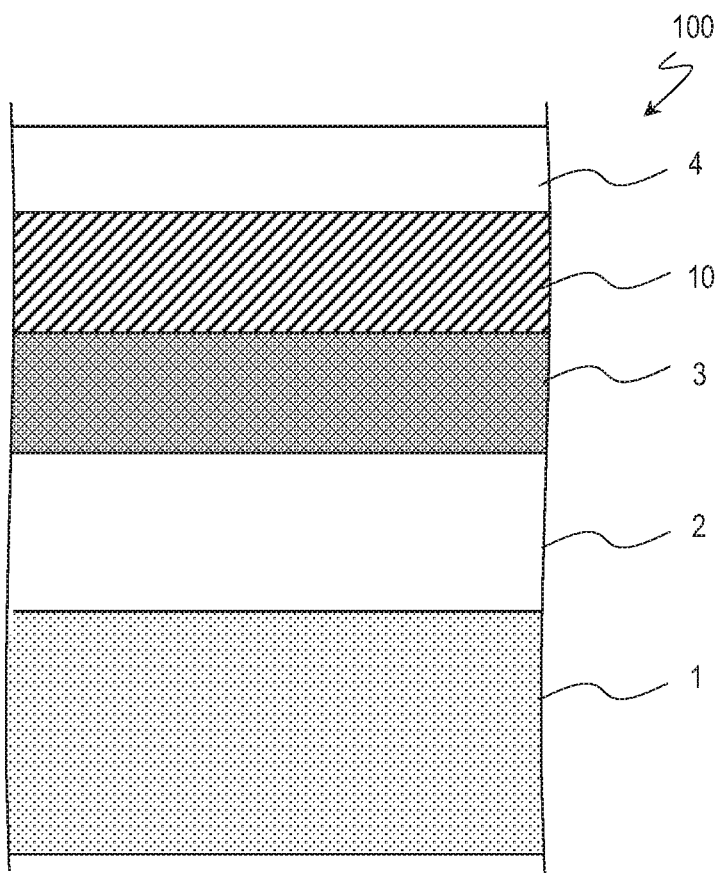
FIG. 1(a) is a schematic partial cross-sectional view of an active region of an OLED display device 100 according to an embodiment of the present invention.
Figure 1B:
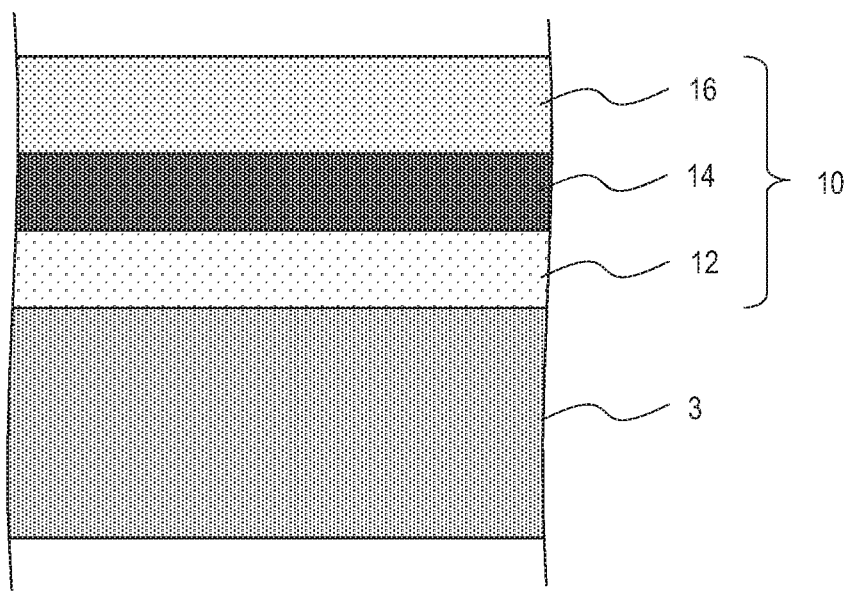
FIG. 1(b) is a partial cross-sectional view of a TFE structure 10 formed on an OLED 3.

First, with reference to FIG. 1(a) and FIG. 1(b), a basic structure of an OLED display device 100 according to an embodiment of the present invention will be described. FIG. 1(a) is a schematic partial cross-sectional view of an active region of the OLED display device 100 according to an embodiment of the present invention. FIG. 1(b) is a partial cross-sectional view of a TFE structure 10 formed on an OLED 3. An OLED display device in each of embodiment 1 and embodiment 2 described below basically has the same structure, and specifically may have the same structure as that of the OLED display device 100 except for the TFE structure.

The OLED display device 100 includes a plurality of pixels, and each of the pixels includes at least one organic EL element (OLED). Herein, a structure corresponding to one OLED will be described for the sake of simplicity.

As shown in FIG. 1(a), the OLED display device 100 includes a flexible substrate (hereinafter, may be referred to simply as a "substrate") 1, a circuit (backplane) 2 formed on the substrate 1 and including a TFT, the OLED 3 formed on the circuit 2, and the TFE structure 10 formed on the OLED 3. The OLED 3 is, for example, of a top emission type. An uppermost portion of the OLED 3 is, for example, a top electrode or a cap layer (refractive index adjusting layer). An optional polarizing plate 4 is located on the TFE structure 10.

The substrate 1 is, for example, a polyimide film having a thickness of 15 μm. The circuit 2 including the TFT has a thickness of, for example, 4 μm. The OLED 3 has a thickness of, for example, 1 μm. The TFE structure 10 has a thickness of, for example, less than, or equal to, 1.5 μm.

FIG. 1(b) is a partial cross-sectional view of the TFE 10 formed on the OLED 3. A first inorganic barrier layer (e.g., SiN layer) 12 is formed immediately on the OLED 3, an organic barrier layer (e.g., acrylic resin layer) 14 is formed on the first inorganic barrier layer 12, and a second inorganic barrier layer (e.g., SiN layer) 16 is formed on the organic barrier layer 14.

For example, the first inorganic barrier layer 12 and the second inorganic barrier layer 16 are each an SiN layer having a thickness of, for example, 400 nm, and the organic barrier layer 14 is an acrylic resin layer having a thickness less than 100 nm. The thicknesses of the first inorganic barrier layer 12 and the second inorganic barrier layer 16 are each independently 200 nm or greater and 1000 nm or less, and the thickness of the organic barrier layer 14 is 50 nm or greater and less than 200 nm. The TFE structure 10 has a thickness of, preferably, 400 nm or greater and less than 2 μm, and more preferably, 400 nm or greater and less than 1.5 μm.

The TFE structure 10 is formed to protect an active region (see an active region R1 in FIG. 2) of the OLED display device 100. As described above, the TFE structure 10 includes the first inorganic barrier layer 12, the organic barrier layer 14 and the second inorganic barrier layer 16 provided in this order on at least the active region, with the first inorganic barrier layer 12 being closest to the OLED 3. The organic barrier layer 14 is not present as a film covering the entirety of the active region, but includes an opening. A portion of the organic barrier layer 14, more specifically, a portion where the organic film is actually present, will be referred to as a "solid portion". The opening (may also be referred to as a "non-solid portion") does not need to be enclosed by the solid portion and includes a cut-out portion or the like. In the opening, the first inorganic barrier layer 12 and the second inorganic barrier layer 16 are in direct contact with each other. The opening of the organic barrier layer 14 includes at least an opening formed to enclose the active region, and the active region is completely enclosed by the portion in which the first inorganic barrier layer 12 and the second inorganic barrier layer 16 are in direct contact with each other (hereinafter, such a portion will be referred to as an "inorganic barrier layer joint portion".

Embodiment 1

With reference to FIG. 2 through FIG. 5, an OLED display device and a method for producing the same according to embodiment 1 of the present invention will be described.

Figure 2:
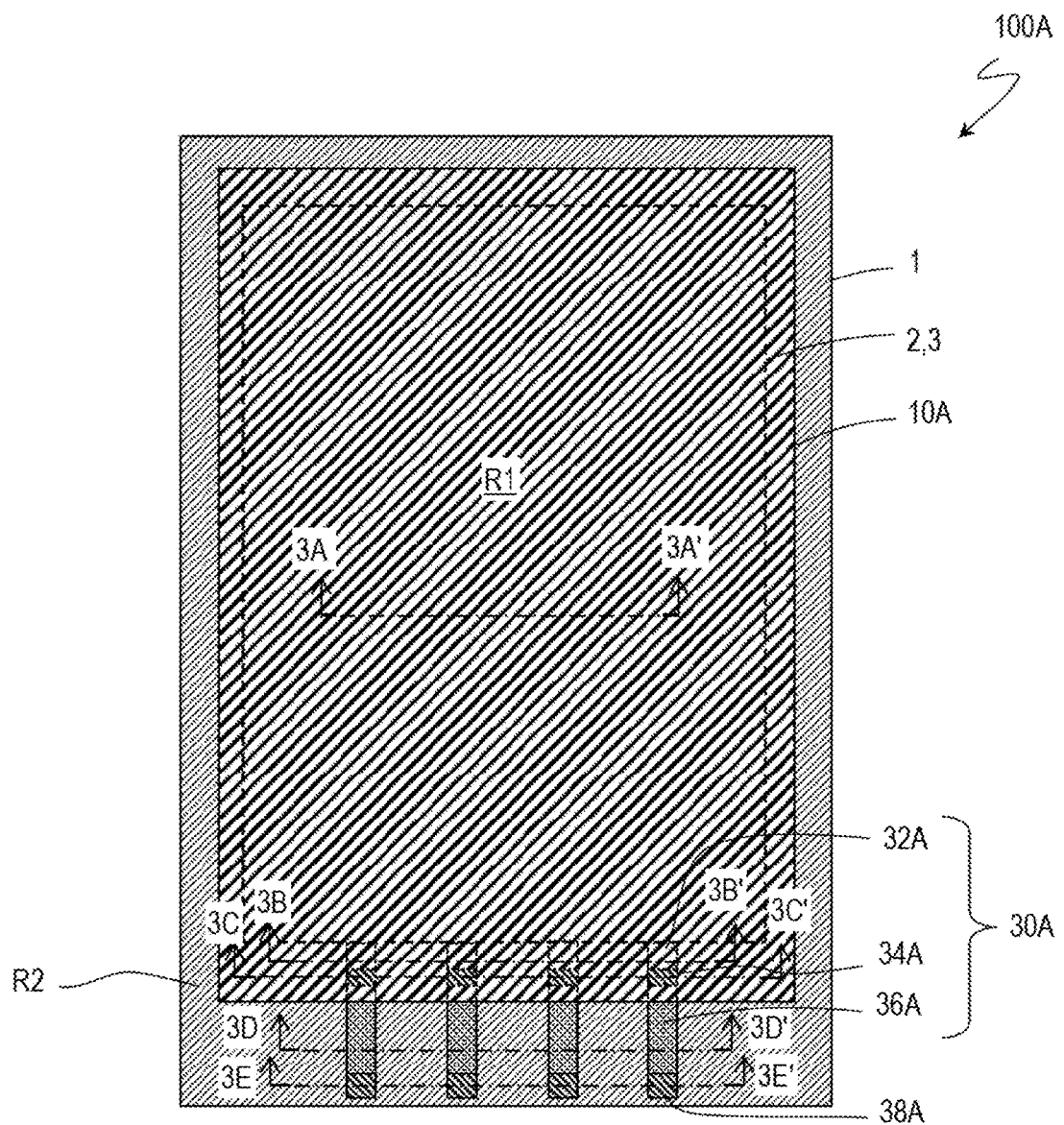
FIG. 2 is a plan view schematically showing a structure of an OLED display device 100A according to embodiment 1 of the present invention.

FIG. 2 is a schematic plan view of an OLED display device 100A according to embodiment 1 of the present invention.

The OLED display device 100A includes the flexible substrate 1, the circuit (may be referred to as a "backplane") 2 formed on the substrate 1, a plurality of the OLEDs 3 formed on the circuit 2, and a TFE structure 10A formed on the OLEDs 3. A layer including the plurality of OLEDs 3 may be referred to as an "OLED layer 3". The circuit 2 and the OLED layer 3 may share a part of components. The optional polarizing plate (see reference sign 4 in FIG. 1) may further be located on the TFE structure 10A. In addition, for example, a layer having a touch panel function may be located between the TFE structure 10A and the polarizing plate. Namely, the OLED display device 100A may be altered to a display device including an on-cell type touch panel.

The circuit 2 includes a plurality of TFTs (not shown), and a plurality of gate bus lines (not shown) and a plurality of source bus lines (not shown) each connected to either one of the plurality of TFTs (not shown). The circuit 2 may be a known circuit that drives the plurality of OLEDs 3. The plurality of OLEDs 3 are each connected with either one of the plurality of TFTs included in the circuit 2. The OLEDs 3 may be known OLEDs.

The OLED display device 100A further includes a plurality of terminals 38A located in a peripheral region R2 outer to the active region (region enclosed by the dashed line in FIG. 2) R1, where the plurality of OLEDs 3 are located, and also includes a plurality of lead wires 30A each connecting either one of the plurality of terminals 38A and either one of the plurality of gate bus lines or either one of the plurality of source bus lines to each other. The TFE structure 10A is formed on the plurality of OLEDs 3 and on portions of the plurality of lead wires 30A, the portions being closer to the active region R1. Namely, the TFE structure 10A covers the entirety of the active region R1 and is also selectively formed on the portions of the plurality of lead wires 30A that are closer to the active region R1. Neither portions of the plurality of lead wires 30A that are closer to the terminals 38A, nor the terminals 38A, are covered with the TFE structure 10A.

Hereinafter, an example in which the lead wires 30A and the terminals 38A are integrally formed of the same conductive layer will be described. Alternatively, the lead wires 30A and the terminals 38A may be formed of different conductive layers (encompassing stack structures).

Figure 3A:
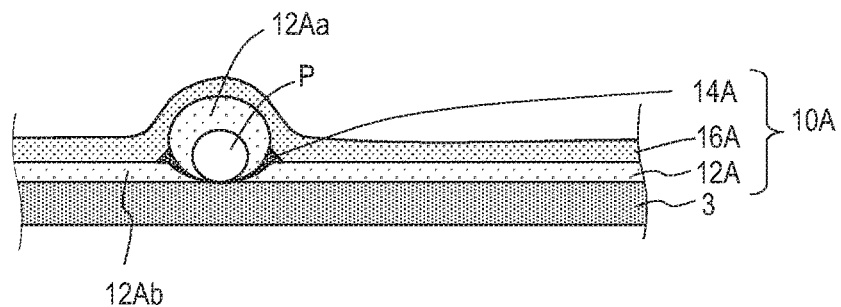
FIG. 3(a) through FIG. 3(e) are each a schematic cross-sectional view of the OLED display device 100A.
Figure 3B:
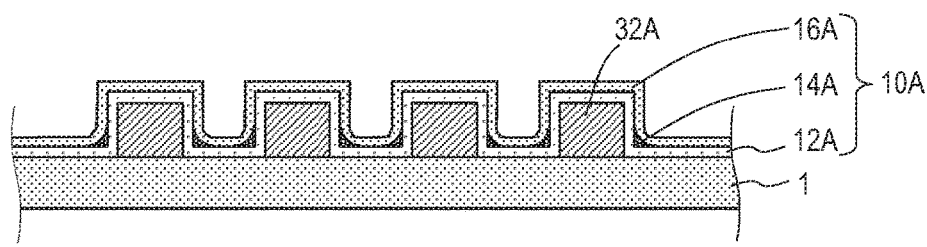
Figure 3C:
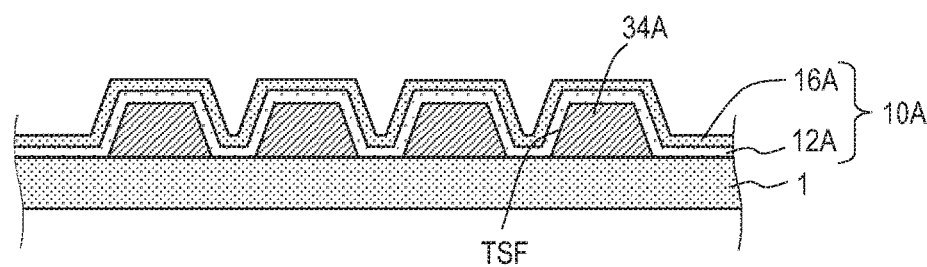
Figure 3D:
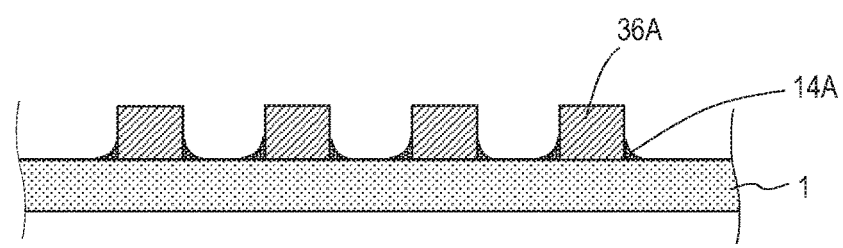
Figure 3E:
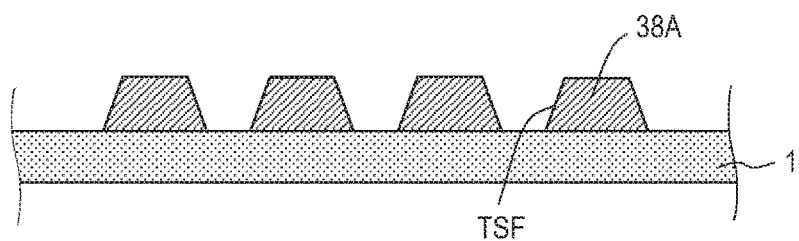

Now, with reference to FIG. 3(a) through FIG. 3(e), the TFE structure 10A of the OLED display device 100A will be described. FIG. 3(a) is a cross-sectional view taken along line 3A-3A' in FIG. 2. FIG. 3(b) is a cross-sectional view taken along line 3B-3B' in FIG. 2. FIG. 3(c) is a cross-sectional view taken along line 3C-3C' in FIG. 2. FIG. 3(d) is a cross-sectional view taken along line 3D-3D' in FIG. 2. FIG. 3(e) is a cross-sectional view taken along line 3E-3E' in FIG. 2. FIG. 3(d) and FIG. 3(e) are cross-sectional views of a region where the TFE structure 10A is not formed, but are provided because an organic barrier layer 14A may extend to a region where the terminals 38A are formed (terminal region).

As shown in FIG. 3(a) through FIG. 3(c), the TFE structure 10A includes a first inorganic barrier layer 12A formed on the OLED 3, the organic barrier layer 14A in contact with the first inorganic barrier layer 12A, and a second inorganic barrier layer 16A in contact with the organic barrier layer 14A. The first inorganic barrier layer 12A and the second inorganic barrier layer 16A are each, for example, an SiN layer, and are selectively formed in a predetermined region by plasma CVD by use of a mask so as to cover the active region R1.

The organic barrier layer 14A may be formed by, for example, the method described in Patent Document No. 2 or 3. For example, in a chamber, a vapor-like or mist-like organic material (e.g., acrylic monomer) is supplied onto an element substrate maintained at a temperature lower than, or equal to, room temperature, then is condensed on the element substrate, and is located locally, more specifically, at a border between a side surface of a protruding portion and a flat portion of the first inorganic barrier layer 12A, by a capillary action or a surface tension of the organic material, which has been put into a liquid state. Then, the organic material is irradiated with, for example, ultraviolet light to form a solid portion of the organic barrier layer (e.g., acrylic resin layer) 14A in the border region in the vicinity of the protruding portion. The organic barrier layer 14A formed by this method does not substantially include a solid portion on the flat portion. Regarding the method for forming the organic barrier layer, the disclosures of Patent Documents Nos. 2 and 3 are incorporated herein by reference.

Alternatively, the organic barrier layer 14A in the TFE structure 10A may be formed by a method for forming a TFE structure 10D included in an OLED display device in embodiment 2 described below. This method is changed as follows in order to form the TFE structure 10A. An initial thickness of a resin layer formed by use of a film formation device 200 is adjusted (to, for example, less than 100 nm), and/or ashing conditions (including time) are adjusted.

FIG. 3(a) is a cross-sectional view taken along line 3A-3A' in FIG. 2, and shows a portion including a particle P. The particle P is a microscopic dust particle generated during the production of the OLED display device, and is, for example, a microscopic piece of broken glass, a metal particle or an organic particle. Such a particle is generated especially easily in the case where mask vapor deposition is used.

As shown in FIG. 3(a), the organic barrier layer (solid portion) 14A may be formed only in the vicinity of the particle P. A reason for this is that the acrylic monomer supplied after the first inorganic barrier layer 12A is formed is condensed and present locally, more specifically, in the vicinity of a surface of a first inorganic barrier layer 12Aa on the particle P (the surface has a tapering angle larger than 90 degrees). The organic barrier layer 14A includes the opening (non-solid portion) on the flat portion of the first inorganic barrier layer 12A.

Figure 4A:
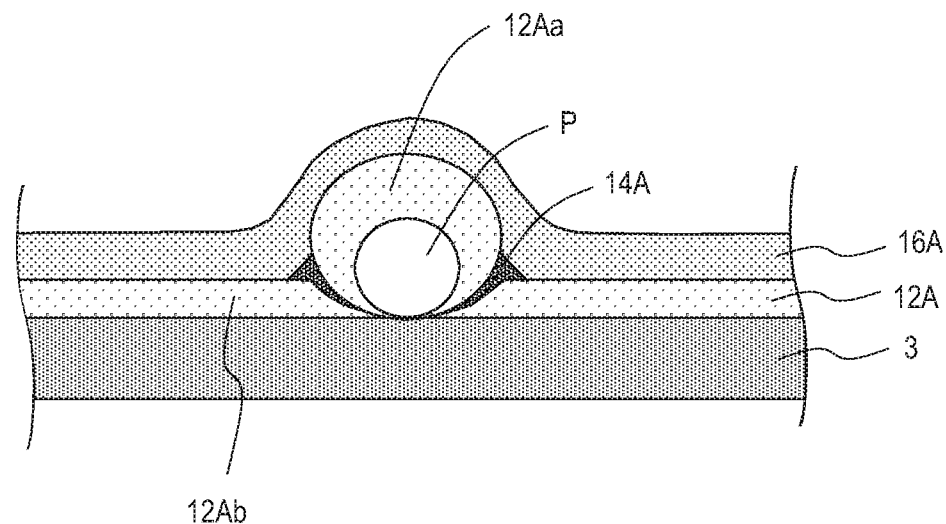
FIG. 4(a) is an enlarged view of a portion including a particle P shown in FIG. 3(a)
Figure 4B:
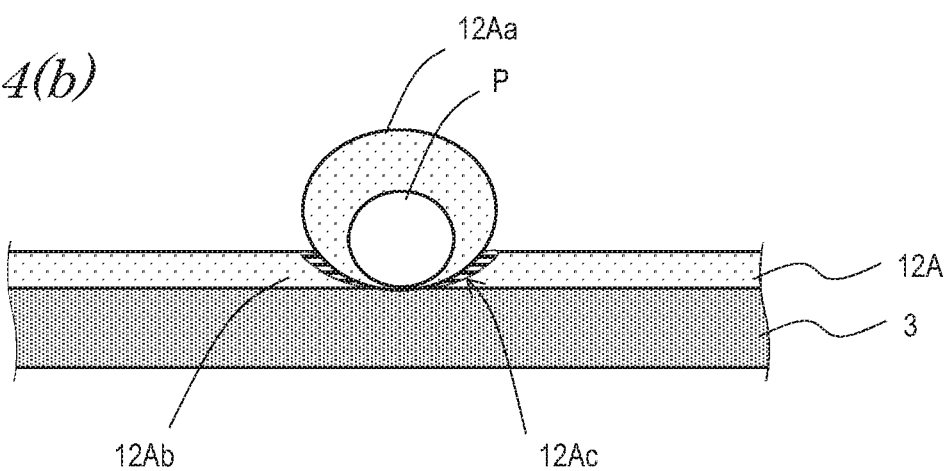
FIG. 4(b) is a schematic cross-sectional view of a first inorganic barrier layer (SiN layer) covering the particle P.

Now, with reference to FIG. 4(a) and FIG. 4(b), a structure of a portion including the particle P will be described. FIG. 4(a) is an enlarged view of the portion including the particle P shown in FIG. 3(a). FIG. 4(b) is a schematic cross-sectional view of the first inorganic barrier layer (e.g., SiN layer) covering the particle P.

Referring to FIG. 4(b), in the case where the particle P (having a diameter, for example, longer than, or equal to, 1 μm) is present, a crack (defect) 12Ac may be formed in the first inorganic barrier layer. As described below, this is considered to be caused by impingement of the SiN layer 12Aa growing from a surface of the particle P and an SiN layer 12Ab growing from a flat portion of a surface of the OLED 3. In the case where such a crack 12Ac is present, the level of barrier property of the TFE structure 10A is decreased.

In the TFE structure 10A in the OLED display device 100A, as shown in FIG. 4(a), the organic barrier layer 14A is formed to fill the crack 12Ac of the first inorganic barrier layer 12A, and a surface of the organic barrier layer 14A couples a surface of the first inorganic barrier layer 12Aa on the particle P and a surface of the first inorganic barrier layer 12Ab on the flat portion of the OLED 3 to each other continuously and smoothly. Therefore, the second inorganic barrier layer 16A formed on the first inorganic barrier layer 12A on the particle P and on the organic barrier layer 14A has no defect formed therein and is formed as a fine film. As can be seen, even if there is the particle P, the organic barrier layer 14A keeps high the level of barrier property of the TFE structure 10A.

Now, with reference to FIG. 3(b) and FIG. 3(c), a structure of the TFE structure 10A on the lead wires 30A will be described. FIG. 3(b) is a cross-sectional view taken along line 3B-3B' in FIG. 2, more specifically, is a cross-sectional view of portions 32A of the lead wires 30, the portions 32A being closer to the active region R1. FIG. 3(c) is a cross-sectional view taken along line 3C-3C' in FIG. 2, more specifically, is a cross-sectional view of portions 34A each including a forward tapering side surface portion (inclining side surface portion) TSF having a tapering angle smaller than 90 degrees.

The lead wires 30A are patterned by the same step as that of, for example, the gate bus lines or the source bus lines. Thus, in the example described below, the gate bus lines and the source bus lines formed in the active region R1 also have the same cross-sectional structure as that of the portions 32A of the lead wires 30A closer to the active region R1 shown in FIG. 3(b).

The OLED display device 100A according to an embodiment of the present invention is preferably usable for, for example, medium- to small-sized high-definition smartphones and tablet terminals. In a medium- to small-sized (e.g., 5.7-type) high-definition (e.g., 500 ppi) OLED display device, it is preferred that the lines (encompassing the gate bus lines and the source bus lines) in the active region R1 have a cross-sectional shape, in a direction parallel to a line width direction thereof, close to a rectangle (side surfaces of the lines have a tapering angle of about 90 degrees) in order to allow the lines to have a sufficiently low resistance with a limited line width. The active region R1 of the OLED display device 100A is substantially enclosed by the inorganic barrier layer joint portion, in which the first inorganic barrier layer 12A and the second inorganic barrier layer 16A are in direct contact with each other. Therefore, it does not occur that the organic barrier layer 14A acts as a moisture entrance route allowing the moisture to reach the active region R1 of the OLED display device. The inorganic barrier layer joint portion is formed on a portion of each of the lead wires 30A that includes a forward tapering side surface portion. In the case where the forward tapering side surface portion is formed, where a bottom surface of the lead wire 30A has a constant width, the cross-sectional area size of the lead wire 30A is decreased and thus the resistance is increased. Therefore, it is preferred that the lead wire 30A includes the forward tapering side surface portion selectively only in a portion thereof whereas the remaining portion of the lead wire 30A has a rectangular cross-section in order to have a low resistance. It is preferred that the lines formed in the active region R1 also have a rectangular cross-section. The length of the portion of the lead wire 30A that includes the forward tapering side surface portion may be appropriately set based on the relationship between the moisture-resistance reliability and the resistance. It should be noted that if a sufficiently low resistance is provided, the lead wire 30A may include the forward tapering side surface portion in the entire length thereof.

The OLED display device 100A is, for example, a medium- or small-sized high-definition display device, and the side surfaces of the gate bus lines and the source bus lines have a tapering angle of about 90 degrees in a cross-section parallel to the line width direction. The side surfaces of the portion 32A of the lead wire 30A closer to the active region R1 have a tapering angle of about 90 degrees in a cross-section parallel to the line width direction, like the gate bus lines or the source bus lines. The organic barrier layer (solid portion) 14A is formed on a lowermost portion of the first inorganic barrier layer 12A covering the portion 32A of the lead wire 30A (at the border between the portion covering each side surface of the lead wire 30A and the portion formed on the flat portion of the substrate 1). A reason for this is that the organic material tends to be located locally, more specifically, in a portion, of the first inorganic barrier layer 12A, that has a surface having an angle smaller than, or equal to, 90 degrees.

By contrast, referring to FIG. 3(c), the portion 34A of the lead wire 30A includes a forward tapering side surface portion (inclining side surface portion) TSF having a tapering angle smaller than 90 degrees. The tapering angle of the forward tapering side surface portion TSF is preferably 85 degrees or smaller, and more preferably 70 degrees or smaller. A reason for this is that in the portion including the forward tapering side surface portion TSF, the surface of the first inorganic barrier layer 12A does not have an angle smaller than, or equal to, 90 degrees, and therefore, the organic material is not easily located in this portion. Even if the organic material is located in the portion in which the surface of the first inorganic barrier layer 12A has an angle larger than 90 degrees, the amount of the organic material is smaller than the amount of the organic material in the portion in which the surface of the first inorganic barrier layer 12A has an angle smaller than, or equal to, 90 degrees. Therefore, for example, after the organic barrier layer 14A is once formed, ashing described below may be performed on the organic barrier layer 14A, so that the organic material is removed from the portion in which the surface of the first inorganic barrier layer 12A has an angle larger than 90 degrees.

Referring to FIG. 3(c), on the portion 34A of the lead wire 30A including the forward tapering side surface portion TSF, the organic barrier layer (solid portion) 14A is not present and the first inorganic barrier layer 12A and the second inorganic barrier layer 16A are in direct contact with each other (namely, the inorganic barrier layer joint portion is formed). The organic barrier layer (solid portion) 14A is not formed on the flat portion. Therefore, in the cross-section taken along line 3C-3C' in FIG. 2, the lead wire 30A is covered with the inorganic barrier layer joint portion, in which the first inorganic barrier layer 12A and the second inorganic barrier layer 16A are in direct contact with each other. Therefore, as described above, it does not occur that the organic barrier layer formed along the lead wire acts as a route that guides the water vapor in the air into the active region. From the point of view of the moisture-resistance reliability, it is preferred that the length of the portion 32A of the lead wire 30A, namely, the length of the inorganic barrier layer joint portion, is at least 0.01 mm. There is no specific upper limit on the length of the inorganic barrier layer joint portion. Even if the length of the inorganic barrier layer joint portion exceeds 0.1 mm, the effect of improving the level of moisture-resistance reliability is substantially saturated, and rather, merely increases the width of a frame portion. Therefore, the length of the inorganic barrier layer joint portion is preferably shorter than, or equal to, 0.1 mm, and may be, for example, shorter than, or equal to, 0.05 mm. The conventional TFE structure in which the organic barrier layer is formed by the inkjet method includes an inorganic barrier layer joint portion having a length of about 0.5 mm to about 1.0 mm in consideration of the variance in the position at which an end of the organic barrier layer is located. By contrast, according to an embodiment of the present invention, the length of the inorganic barrier layer joint portion may be shorter than, or equal to, 0.1 mm. This decreases the width of the frame portion of the organic EL display device.

Now, FIG. 3(d) and FIG. 3(e) will be referred to. FIG. 3(d) and FIG. 3(e) are cross-sectional views of the region where the TFE structure 10A is not formed. Portions 36A of the lead wires 30A shown in FIG. 3(d) have substantially the same cross-sectional shape as that of the portions 32A of the lead wires 30A shown in FIG. 3(b). On a lowermost portion of each of side surfaces of the portion 36A, the organic barrier layer 14A is formed. By contrast, the terminals 38A shown in FIG. 3(e) have substantially the same cross-sectional shape as that of the portions 34A of the lead wires 30A shown in FIG. 3(c), and each include a forward tapering side surface portion TSF having a tapering angle smaller than 90 degrees. Therefore, the organic barrier layer (solid portion) 14A is not present on side surfaces of the terminals

38A. The organic barrier layer (solid portion) 14A is not present either on the flat portion.

As described above, the organic barrier layer 14A is formed by a method including a step of supplying a vapor-like or mist-like organic material (e.g., acrylic monomer), and therefore, cannot be selectively formed only in a predetermined region, unlike the first inorganic barrier layer 12A or the second inorganic barrier layer 16A. Therefore, the organic barrier layer (solid portion) 14A may be undesirably formed also on the terminals 38A. This requires the organic barrier layer 14A on the terminals 38A to be removed, which decreases the mass-productivity. Formation of the forward tapering side surface portion TSF on each of the side surfaces of each terminal 38A suppresses the formation of the organic barrier layer (solid portion) 14A on the side surfaces of the terminals 38A. It is preferred that the forward tapering side surface portion TSF is formed on the entirety of each of side surfaces of the terminals 38A. The organic barrier layer (solid portion) 14A, even if being formed on the side surfaces or top surfaces of the terminals 38A, may be removed by ashing.

The portions 36A of the lead wires 30A shown in FIG. 3(*d*) may have substantially the same cross-sectional shape as that of the portions 34A shown in FIG. 3(*c*) and the terminals 38A shown in FIG. 3(*e*). In the step of forming the lead wires 30A, the lead wires 30A may each be formed to include the forward tapering side surface portion TSF by one exposure step by a photolithography step using a multi-gray scale mask (half-tone mask or gray-tone mask). In this specification, the "photolithography step" includes resist supply, exposure, development, etching using the resist as a mask, and peel-off of the resist.

Figure 5A:
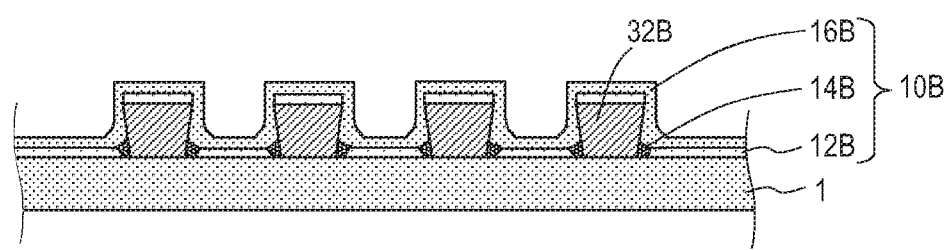
FIG. 5(a) and FIG. 5(b) are respectively schematic partial cross-sectional views of TFE structures 10B and 10C included in other OLED display devices according to embodiment 1.
Figure 5B:
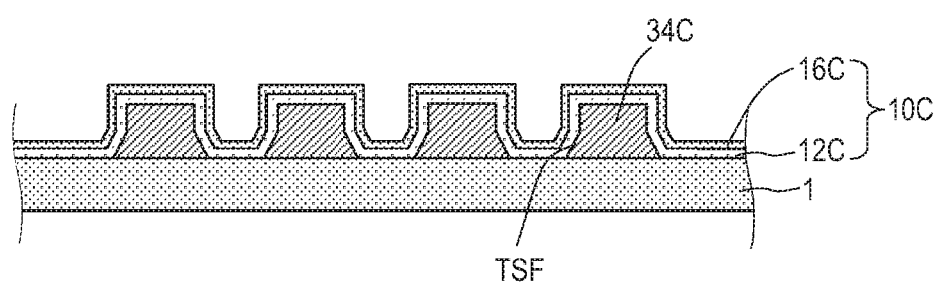

Now, FIG. 5(*a*) and FIG. 5(*b*) will be referred to. FIG. 5(*a*) and FIG. 5(*b*) are respectively schematic partial cross-sectional views of TFE structures 10B and 10C included in other OLED display devices according to embodiment 1.

FIG. 5(*a*) is a schematic cross-sectional view of the TFE structure 10B taken along line 3B-3B' in FIG. 2, more specifically, is a cross-sectional view of portions 32B of the lead wires, the portions 32B being closer to the active region R1.

In the case where, for example, the lead wires 30A having a cross-sectional shape shown in FIG. 3(*b*) are to be formed, the portions 32B each having inversely tapering side surfaces as shown in FIG. 5(*a*) may undesirably be formed due to variance in the process conditions. When the inversely tapering side surfaces are formed, a first inorganic barrier layer 12B becomes discontinuous. Even in this case, an organic barrier layer 14B is formed on a lowermost portion of each of side surfaces of the portions 32B of the lead wires, so that a second inorganic barrier layer 16B with no defect is formed thereon. In this manner, in the case where the particle P is present or in the case where a pattern having an inversely tapering cross-sectional shape is formed, the organic barrier layer 14B suppresses the level of moisture-resistance reliability from being decreased.

FIG. 5(*b*) is a schematic cross-sectional view of the TFE structure 10C taken along line 3C-3C' in FIG. 2. In the TFE structure 10A, the entirety of each side surface of the portion 34A is a forward tapering side surface portion TSF. As shown in FIG. 5(*b*), portions 34C may each have side surfaces each including a forward tapering side surface portion TSF at least on a lowermost portion thereof. The organic material (e.g., acrylic monomer) tends to be located locally, more specifically, on the lowermost portion of the side surface (border with the flat portion). Therefore, it is sufficient to suppress the organic material from being located on this portion. It is preferred that the forward tapering side surface portion TSF has a height (length in a direction normal to the substrate) that is greater than the thickness of the organic material, for example, greater than, or equal to, 50 nm, more preferably greater than, or equal to, 100 nm. It is preferred that the portion of each of the lines that includes the forward tapering side surface portion does not include an inversely tapering portion. On the portion 34C having such a cross-sectional shape with no inversely tapering portion, even if the organic barrier layer is not present, a first inorganic barrier layer 12C and a second inorganic barrier layer 16C with no defect are formed.

In consideration of the process margin, the forward tapering side surface portion has a tapering angle smaller than 85 degrees, preferably smaller than, or equal to, 70 degrees. It is preferred that the remaining portions of the lines have a tapering angle set to be larger than 85 degrees and 90 degrees or smaller. It is preferred that the difference in the tapering angles is larger than, or equal to, 15 degrees. There is no specific lower limit on the tapering angle of the forward tapering side surface portion. It is preferred that the tapering angle is larger than, or equal to, 30 degrees, for the following reasons. Even if the tapering angle is smaller than 30 degrees, there is no specific difference in the effect of suppressing the organic material from being located locally. Where the distance between the lines is constant, the resistance of the lines is increased; whereas where the resistance of the lines is constant, the distance between the lines is decreased. It is preferred that the gate bus lines, the source bus lines, the lead wires and the terminals having such a cross-sectional shape are formed by dry etching. The tapering angle of the forward tapering side surface portion may be adjusted by the pattern of the multi-gray scale mask (half-tone mask or gray-tone mask), and the tapering angle of the remaining portions of the lines may be adjusted by the dry etching conditions.

Now, with reference to FIG. 6 and FIG. 7, an example of TFT usable for the OLED display device 100A, and an example of lead wires and terminals formed by use of a gate metal layer and a source metal layer used to form the TFT, will be described.

For a medium- or small-sized high-definition OLED display device, a low temperature polycrystalline silicon (hereinafter, referred to simply as "LTPS") TFT or an oxide TFT (e.g., four-component-based (In—Ga—Zn—O-based) oxide TFT containing In (indium), Ga (gallium), Zn (zinc) and O (oxygen)) having a high mobility is preferably used. Structures of, and methods for producing, the LTPS-TFT and the In—Ga—Zn—O-based TFT are well known and will be described below merely briefly.

Figure 6A:
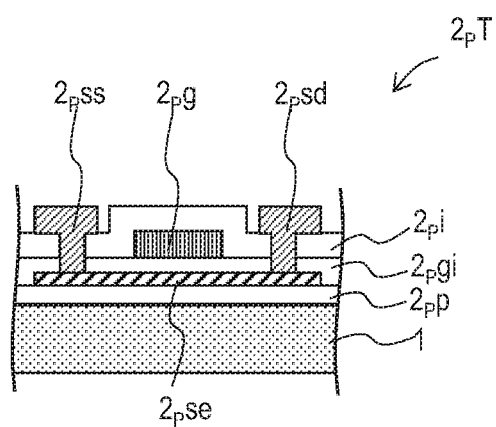
FIG. 6(a) and FIG. 6(b) are each a schematic cross-sectional view showing an example of TFT that may be included in an OLED display device according to embodiment 1.
Figure 6B:
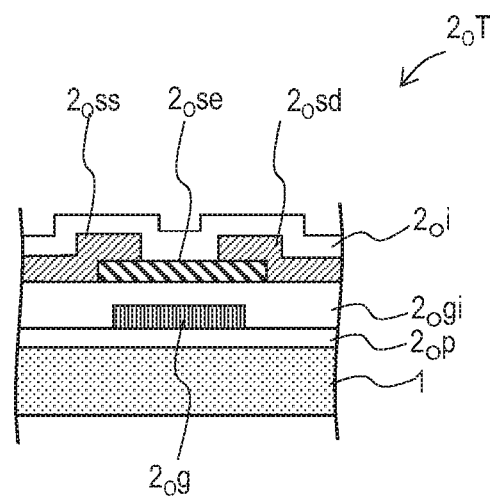

FIG. 6(*a*) is a schematic cross-sectional view of an LTPS-TFT $2_PT$. The TFT $2_PT$ may be included in the circuit 2 of the OLED display device 100. The LTPS-TFT $2_PT$ is a top gate-type TFT.

The TFT $2_PT$ is formed on a base coat $2_Pp$ on the substrate 1 (e.g., polyimide film). Although not described above, it is preferred that a base coat formed of an inorganic insulating material is formed on the substrate 1.

The TFT $2_PT$ includes a polycrystalline silicon layer $2_Pse$ formed on the base coat $2_Pp$, a gate insulating layer $2_Pgi$ formed on the polycrystalline silicon layer $2_Pse$, a gate electrode $2_Pg$ formed on the gate insulating layer $2_Pgi$, an interlayer insulating layer $2_Pi$ formed on the gate electrode $2_Pg$, and a source electrode $2_Pss$ and a drain electrode $2_Psd$ formed on the interlayer insulating layer $2_Pi$. The source electrode $2_Pss$ and the drain electrode $2_Psd$ are respectively connected with a source region and a drain region of the polycrystalline silicon layer $2_P$se in contact holes formed in the interlayer insulating layer $2_P$i and the gate insulating layer $2_P$gi.

The gate electrode $2_P$g is contained in a gate metal layer containing the gate bus lines, and the source electrode $2_P$ss and the drain electrode $2_P$sd are contained in a source metal layer containing the source bus lines. The gate metal layer and the source metal layer are used to form lead wires and terminals (described below with reference to FIG. 7).

The TFT $2_P$T is formed, for example, as follows.

As the substrate 1, a polyimide film having a thickness of 15 µm, for example, is prepared.

The base coat $2_P$p ($SiO_2$ film: 250 nm/$SiN_x$ film: 50 nm/$SiO_2$ film: 500 nm (top layer/middle layer/bottom layer)) and an a-Si film (40 nm) are formed by plasma CVD.

The a-Si film is subjected to dehydrogenation (e.g., annealed at 450° C. for 180 minutes).

The a-Si film is made polycrystalline-siliconized by excimer laser annealing (ELA).

The a-Si film is patterned by a photolithography step to form an active layer (semiconductor island).

A gate insulating film ($SiO_2$ film: 50 nm) is formed by plasma CVD.

A channel region of the active layer is doped with ($B^+$).

The gate metal layer (Mo: 250 nm) is formed by sputtering and patterned by a photolithography step (including a dry etching step) (to form the gate electrode $2_P$g, the gate bus lines, and the like).

A source region and a drain region of the active layer are doped with ($P^+$).

Activation annealing (e.g., annealing at 450° C. for 45 minutes) is performed. As a result, the polycrystalline silicon layer $2_P$se is formed.

An interlayer insulating film (e.g., $SiO_2$ film: 300 nm/$SiN_x$ film: 300 nm (top layer/bottom layer)) is formed by plasma CVD.

The contact holes are formed in the gate insulating film and the interlayer insulating film by dry etching. As a result, the interlayer insulating layer $2_P$i and the gate insulating layer $2_P$gi are formed.

The source metal layer (Ti film: 100 nm/Al film: 300 nm/Ti film: 30 nm) is formed by sputtering and patterned by a photolithography step (including a dry etching step) (to form the source electrode $2_P$ss, the drain electrode $2_P$sd, the source bus lines, and the like).

FIG. 6(*b*) is a schematic cross-sectional view of an In-Ga-Zn-O-based TFT $2_O$t. The TFT $2_O$T may be included in the circuit 2 of the OLED display device 100A. The TFT $2_O$T is a bottom gate-type TFT.

The TFT $2_O$T is formed on a base coat $2_O$p on the substrate 1 (e.g., polyimide film). The TFT $2_O$T includes a gate electrode $2_O$g formed on the base coat $2_O$p, a gate insulating layer $2_O$gi formed on the gate electrode $2_O$g, an oxide semiconductor layer $2_O$se formed on the gate insulating layer $2_O$gi, and a source electrode $2_O$ss and a drain electrode $2_O$sd respectively formed on a source region and a drain region of the oxide semiconductor layer $2_O$se. The source electrode $2_O$ss and the drain electrode $2_O$sd are covered with an interlayer insulating layer $2_O$i.

The gate electrode $2_O$g is contained in a gate metal layer containing the gate bus lines, and the source electrode $2_O$ss and the drain electrode $2_O$sd are contained in a source metal layer containing the source bus lines. The gate metal layer and the source metal layer are used to form lead wires and terminals, and thus the TFT $2_O$T may have a structure described below with reference to FIG. 7.

The TFT $2_O$T is formed, for example, as follows.

As the substrate 1, a polyimide film having a thickness of 15 µm, for example, is prepared.

The base coat $2_O$p ($SiO_2$ film: 250 nm/$SiN_x$ film: 50 nm/$SiO_2$ film: 500 nm (top layer/middle layer/bottom layer)) is formed by plasma CVD.

The gate metal layer (Cu film: 300 nm/Ti film: 30 nm (top layer/bottom layer)) is formed by sputtering and patterned by a photolithography step (including a dry etching step) (to form the gate electrode $2_O$g, the gate bus lines, and the like).

A gate insulating film ($SiO_2$ film: 30 nm/$SiN_x$ film: 350 nm (top layer/bottom layer)) is formed by plasma CVD.

An oxide semiconductor film (In—Ga—Z—O-based semiconductor film: 100 nm) is formed by sputtering and patterned by a photolithography step (including a wet etching step) to form an active layer (semiconductor island).

The source metal layer (Ti film: 100 nm/Al film: 300 nm/Ti film: 30 nm (top layer/middle layer/bottom layer)) is formed by sputtering and patterned by a photolithography step (including a dry etching step) (to form the source electrode $2_O$ss, the drain electrode $2_O$sd, the source bus lines, and the like).

Activation annealing (e.g., annealing at 300° C. for 120 minutes) is performed. As a result, the oxide semiconductor layer $2_O$se is formed.

Then, an interlayer insulating layer $2_O$i (e.g., $SiN_x$ film: 300 nm/$SiO_2$ film: 300 nm (top layer/bottom layer)) is formed by plasma CVD as a protective film.

Now, with reference to FIG. 7(*a*) through FIG. 7(*d*), a structure of another OLED display device according to embodiment 1 will be described. The circuit (backplane) of this OLED display device includes the TFT $2_P$T shown in FIG. 6(*a*) or the TFT $2_O$T shown in FIG. 6(*b*). The gate metal layer and the source metal layer used to form the TFT $2_P$T or the TFT $2_O$T are used to form a lead wire 30A' and a terminal 38A'. FIG. 7(*a*) through FIG. 7(*d*) respectively correspond to FIG. 3(*b*) through FIG. 3(*e*). Components corresponding to those in FIG. 3(*b*) through FIG. 3(*e*) will be represented by the identical reference signs thereto provided with apostrophe "'" at the end. A base coat 2*p* in FIG. 7 corresponds to the base coat $2_P$p in FIG. 6(*a*) and the base coat $2_O$p in FIG. 6(*b*). A gate insulating layer 2*gi* in FIG. 7 corresponds to the gate insulating layer $2_P$gi in FIG. 6(*a*) and the gate insulating layer $2_O$gi in FIG. 6(*b*). An interlayer insulating layer 2*i* in FIG. 7 corresponds to the interlayer insulating layer $2_P$i in FIG. 6(*a*) and the interlayer insulating layer $2_O$i in FIG. 6(*b*).

As shown in FIG. 7(*a*) through FIG. 7(*d*), a gate metal layer 2*g* and a source metal layer 2*s* are formed on the base coat 2*p*, which is formed on the substrate 1. Although not shown in FIG. 3, it is preferred that the base coat 2*p* formed of an inorganic insulating material is formed on the substrate 1.

With reference to FIG. 7(*a*) and FIG. 7(*b*), a structure of a TFE structure 10A' will be described. FIG. 7(*a*) corresponds to a cross-sectional view taken along line 3B-3B' in FIG. 2, and is a cross-sectional view of a portion 32A' of the lead wire 30A', the portion 32A' being closer to the active region. FIG. 7(*b*) corresponds to a cross-sectional view taken along line 3C-3C' in FIG. 2, and is a cross-sectional view of a portion 34A' including a forward tapering side surface portion (inclining side surface portion) TSF having a tapering angle smaller than 90 degrees.

As shown in FIG. 7(*a*) through FIG. 7(*c*), the lead wire 30A' is formed as a stack body of the gate metal layer 2*g* and the source metal layer 2*s*. A portion of the lead wire 30A' that is formed of the gate metal layer 2*g* has, for example, the same cross-sectional shape as that of the gate bus lines. A portion of the lead wire 30A' that is formed of the source metal layer 2s has, for example, the same cross-sectional shape as that of the source bus lines. In the case of, for example, a 5.7-type display device of 500 ppi, the portion formed of the gate metal layer 2g has a line width of, for example, 10 µm, and a distance between two adjacent such lines is 16 µm (L/S=10/16). The portion formed of the source metal layer 2s has a line width of, for example, 16 µm, and a distance between two adjacent such lines is 10 µm (L/S=16/10).

Figure 7A:
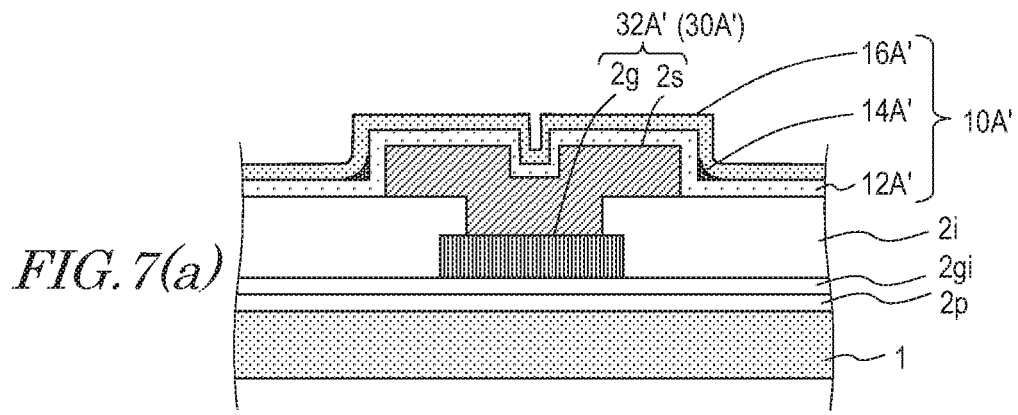
FIG. 7(a) through FIG. 7(d) are each a schematic cross-sectional view of another OLED display device according to embodiment 1 and respectively correspond to FIG. 3(b) through FIG. 3(e).

Referring to FIG. 7(a), the portion 32A' of the lead wire 30A' closer to the active region has a side surface having a tapering angle of about 90 degrees in a cross-section parallel to a line width direction thereof, like that of the gate bus lines and the source bus lines. An organic barrier layer (solid portion) 14A' is formed on a lowermost portion of a first inorganic barrier layer 12A' covering the portion 32A' of the lead wire 30A' (at a border between a portion covering a side surface of the lead wire 30A' and a portion formed on the flat portion of the substrate 1).

Figure 7B:
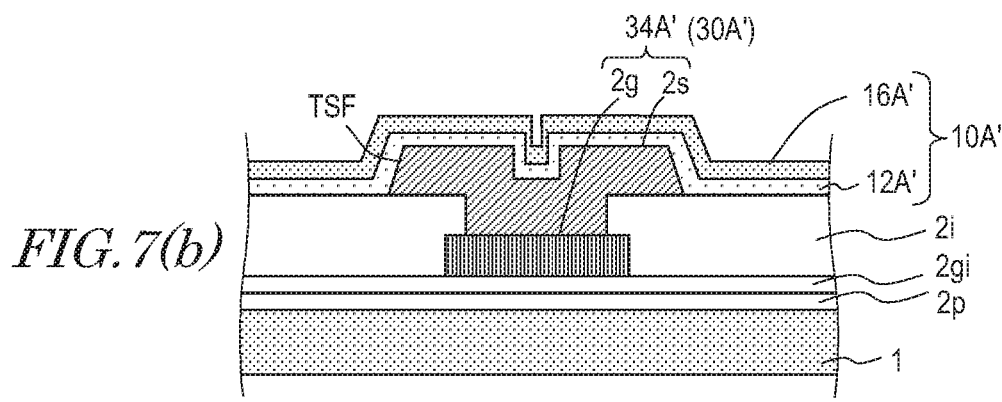

By contrast, referring to FIG. 7(b), the portion 34A' of the lead wire 30A' includes a forward tapering side surface portion (inclining side surface portion) TSF having a tapering angle smaller than 90 degrees. On the portion 34A' of the lead wire 30A' including the forward tapering side surface portion TSF, the organic barrier layer (solid portion) 14A' is not present and the first inorganic barrier layer 12A' and a second inorganic barrier layer 16A' are in direct contact with each other (namely, an inorganic barrier joint portion is formed). On the flat portion, the organic barrier layer (solid portion) 14A' is not present. Therefore, in a cross-section taken along line 3C-3C' of FIG. 2, the lead wire 30A' is covered with the inorganic barrier joint portion, in which the first inorganic barrier layer 12A' and the second inorganic barrier layer 16A' are in direct contact with each other.

Figure 7C:
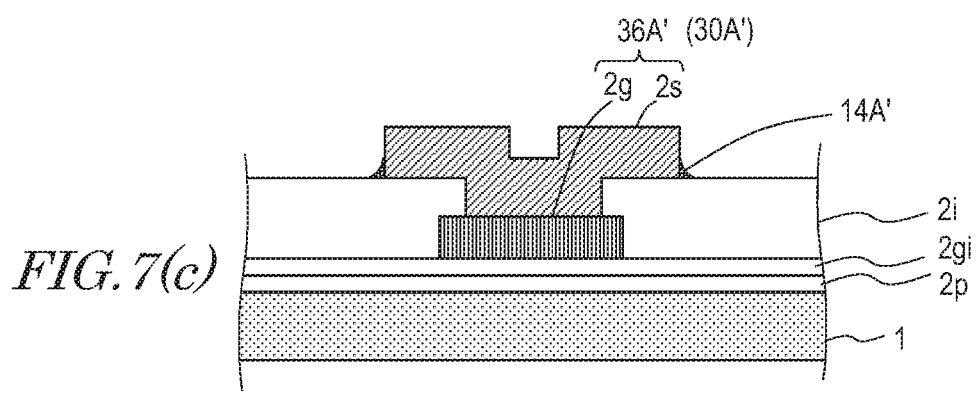
Figure 7D:
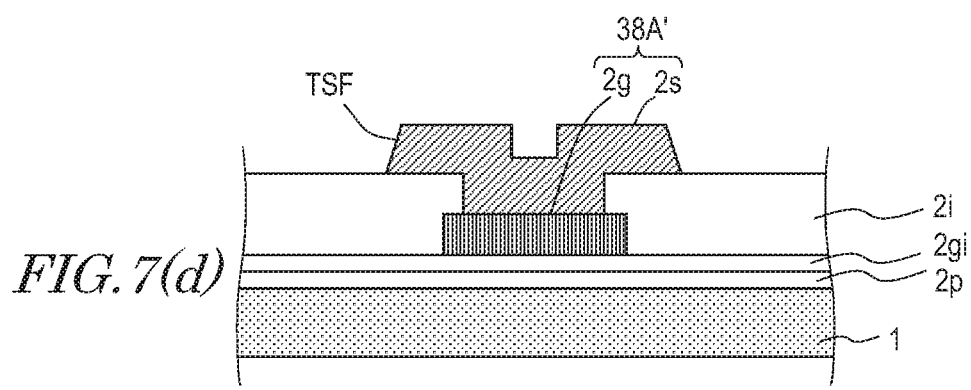

Now, FIG. 7(c) and FIG. 7(d) will be referred to. FIG. 7(c) and FIG. 7(d) are each a cross-sectional view of a region where the TFE structure 10A' is not formed. A portion 36A' of the lead wire 30A' shown in FIG. 7(c) has a cross-sectional shape substantially the same as that of the portion 32A' of the lead wire 30A' shown in FIG. 7(a), and the organic barrier layer 14A' is formed on a lowermost portion of a side surface of the portion 36A'. A terminal 38A' shown in FIG. 7(d) has a cross-sectional shape substantially the same as that of the portion 34A' of the lead wire 30A' shown in FIG. 7(b), and includes a forward tapering side surface portion TSF having a tapering angle smaller than 90 degrees. Therefore, the organic barrier layer (solid portion) 14A' is not present on a side surface of the terminal 38A'. The organic barrier layer (solid portion) 14A' is not present either on the flat portion.

FIG. 7(b) shows an example in which each of the two side surfaces of the lead wire 30A' that are in contact with the first inorganic barrier layer 12A' is entirety the forward tapering side surface portion TSF. As described above with reference to FIG. 5(b), as long as there is a forward tapering side surface portion TSF at least on a lowermost portion of each of the two side surfaces in contact with the first inorganic barrier layer 12A', the above-described effect is provided. Similarly, FIG. 7(d) shows an example in which each of all the exposed side surfaces is entirety the forward tapering side surface portion TSF. As long as there is a forward tapering side surface portion TSF at least on a lowermost portion of each of all the exposed side surfaces, the above-described effect is provided.

Embodiment 2

The method for producing the OLED display device according to embodiment 1 includes, for example, the following steps. In at least a portion of each of the plurality of lead wires 30A, the forward tapering side surface portion is formed of at least on a lowermost portion of each of two exposed side surfaces thereof. The forward tapering side surface portion is formed to have a tapering angle smaller than 90 degrees in a cross-section parallel to the line width direction of the lead wire 30A. Next, the first inorganic barrier layer 12A is formed selectively on the active region R1. Then, a vapor-like or mist-like acrylic monomer is supplied into the chamber, and is condensed on the first inorganic barrier layer 12A. In this step, the acrylic monomer is condensed so as not to be present on the portion of each lead wire 30A including the forward tapering side surface portion. The condensed acrylic monomer is irradiated with light (e.g., ultraviolet light) to form the organic barrier layer 14 of an acrylic resin.

The above-described method, by which the acrylic monomer is located locally, has a problem that the process margin is narrow. A method for producing an OLED display device in embodiment 2 described below includes a step of forming a resin layer (e.g., acrylic resin layer) also at least on a part of the flat portion and partially ashing the resin layer to form an organic barrier layer. The organic barrier layer may be formed in any of various forms by adjusting the thickness of a resin layer to be formed initially (e.g., to less than 100 nm) and/or by adjusting the ashing conditions (including time). Namely, the organic barrier layer 14A included in the OLED display device 100A described in embodiment 1 may be formed, or an organic barrier layer (solid portion) covering a part of, or the entirety of, the flat portion may be formed. An organic barrier layer having a large area size provides an effect of improving the resistance against bending. In the following, an OLED display device including a TFE structure that includes an organic barrier layer (solid portion) covering a part of, or the entirety of, the flat portion, and a method for producing the same, will be mainly described. The structure of the element substrate before the TFE structure is formed, especially, the structure of the lead wires and the terminals, and the structure of the TFE structure, may be any of those described in embodiment 1.

Figure 8A:
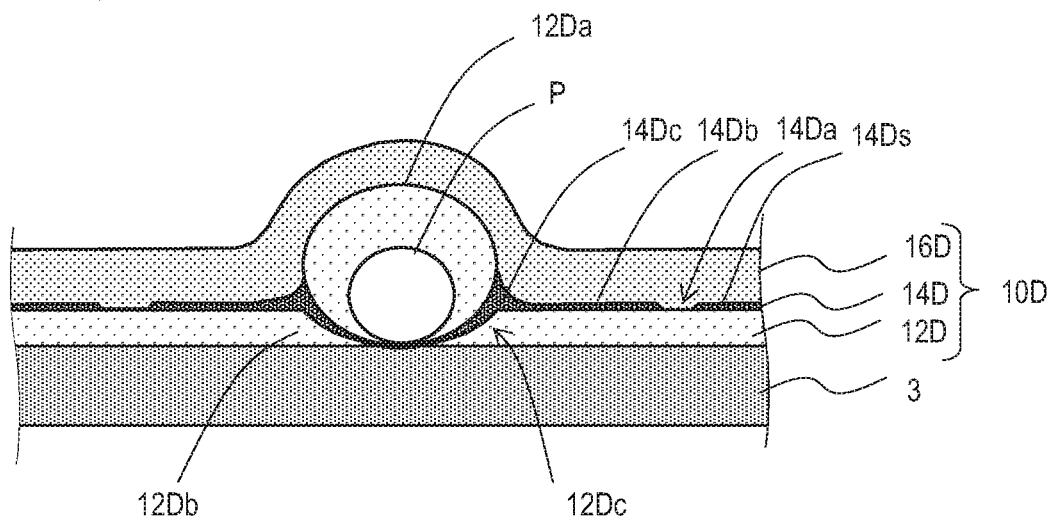
FIG. 8(a) and FIG. 8(b) include schematic partial cross-sectional views of a TFE structure 10D in an OLED display device according to embodiment 2 of the present invention.
Figure 9:
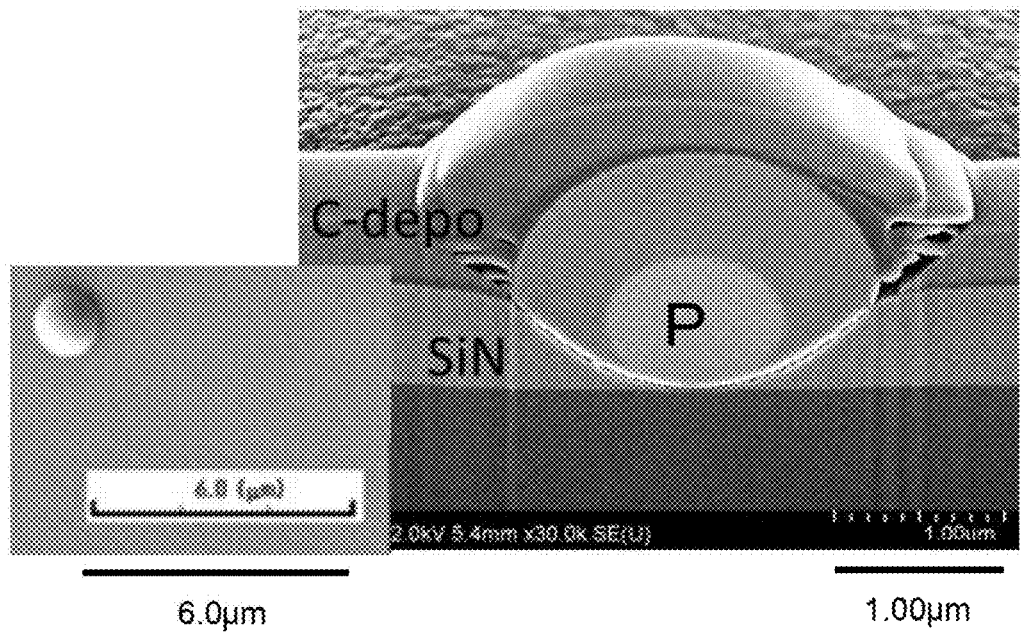
FIG. 9 shows a cross-sectional SEM image of a first inorganic barrier layer (SiN layer) covering a particle (silica sphere having a diameter of 1 µm), and also shows a planar SEM image (left bottom).

FIG. 8(a) is a schematic partial cross-sectional view of a TFE structure 10D in an OLED display device according to embodiment 2 of the present invention, and shows a portion including a particle P. As described above with reference to FIG. 4(b), in the case where the particle P is present, a crack (defect) 12Dc may be formed in a first inorganic barrier layer 12D. Based on a cross-sectional SEM image shown in FIG. 9, this is considered to be caused by impingement of an SiN layer 12Da growing from a surface of the particle P and an SiN layer 12Db growing from the flat portion of the surface of the OLED 3. In the case where such a crack 12Dc is present, the level of barrier property of the TFE structure 10D is decreased. The cross-sectional SEM image shown in FIG. 9 is of a sample of SiN film formed by plasma CVD in the state where a silica sphere having a diameter of 1 µm is located as the particle P on a glass substrate. The cross-section does not pass the center of the particle P. An outermost surface of the particle P is a carbon layer (C-depo) used to protect the sphere at the time of cross-section processing. As can be seen, mere presence of a relatively small silica sphere having a diameter of 1 µm results in the formation of the crack (defect) 12Dc in the SiN layer 12D.

In the TFE structure 10D in the OLED display device in embodiment 2, as shown in FIG. 8(a), an organic barrier layer 14Dc is formed to fill the crack 12Dc of the first inorganic barrier layer 12D and a portion of the first inorganic barrier layer 12D that is overhung by the particle P.

Figure 10:
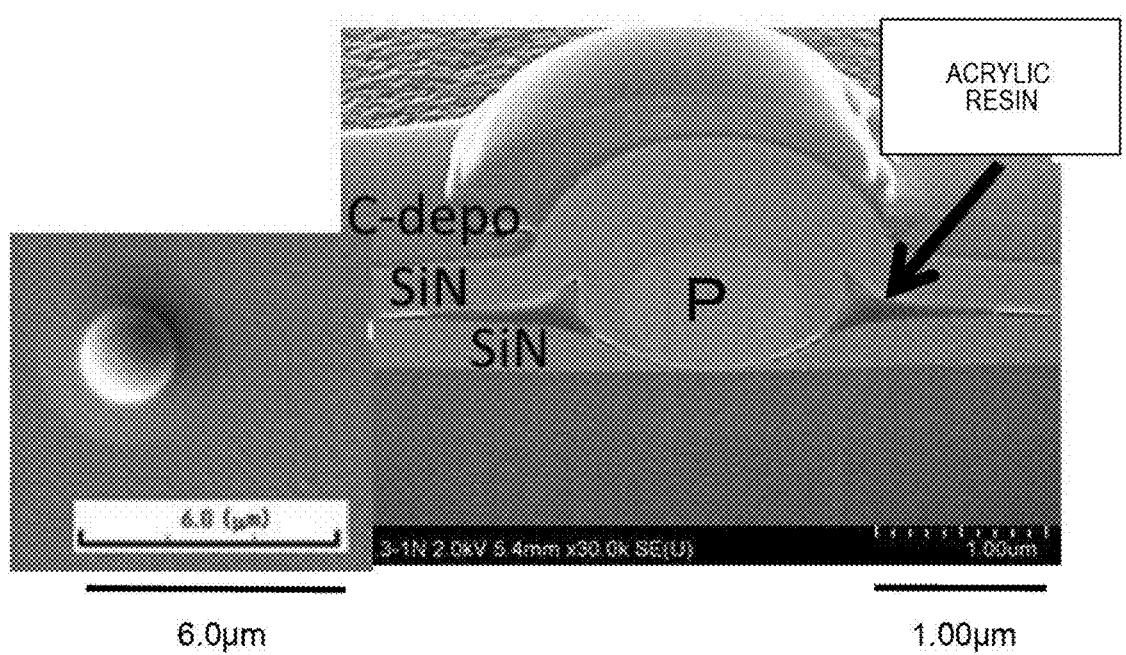
FIG. 10 shows a cross-sectional SEM image of a TFE structure covering a particle (silica sphere having a diameter of 2.15 μm), and also shows a planar SEM image (left bottom).

Therefore, the level of barrier property is kept high by a second inorganic barrier layer 16D. This may be confirmed by a cross-sectional SEM image shown in FIG. 10. In FIG. 10, no interface is observed at a position where the second inorganic barrier layer 16D is formed directly on the first inorganic barrier layer 12D. In the schematic view, however, the first inorganic barrier layer 12D and the second inorganic barrier layer 16D are shown with different types of hatching for easier understanding.

The cross-sectional SEM image shown in FIG. 10 is of a sample of the TFE structure 10D formed in the state where a silica sphere having a diameter of 2.15 μm is located on a glass substrate, like the cross-sectional SEM image shown in FIG. 9. As can be seen from a comparison between FIG. 10 and FIG. 9, the diameter of the particle P shown in FIG. 10 is about twice the diameter of the particle P shown in FIG. 9. It is seen that even in the case of FIG. 10, the SiN film formed on the acrylic resin layer is fine film with no defect. Another sample may be formed as follows. An SiN film is formed by plasma CVD so as to cover particles P (silica spheres having a diameter of 2.15 μm and a diameter of 4.6 μm), and then an acrylic resin layer is formed as the organic barrier layer 14D. Then, another SiN film is formed by plasma CVD. Like in the case of FIG. 9, in this sample also, the SiN film formed on the acrylic resin layer has been observed by an SEM to be a fine film with no defect.

As described below, the organic barrier layer 14D shown in FIG. 8(a) is formed of, for example, an acrylic resin. It is especially preferred that the organic barrier layer 14D is formed by curing an acrylic monomer (acrylate) having a viscosity of about 1 to about 100 mPa·s at room temperature (e.g., 25° C.) by light (e.g., ultraviolet light). An acrylic monomer having such a low viscosity may easily permeate the crack 12Dc and the portion overhung by the particle P. The acrylic resin has a high visible light transmittance and thus is preferably usable for a top emission-type OLED display device. A photoinitiator may be incorporated into the acrylic monomer when necessary. The photosensitive wavelength may be adjusted by the type of the photoinitiator. The acrylic monomer may be replaced with another photocurable resin. A preferred photocurable resin is an ultraviolet-curable resin from the point of view of the reactivity and the like. The ultraviolet light to be directed toward the resin is preferably near ultraviolet light (200 nm or longer and 400 nm or shorter), and is especially preferably near ultraviolet light in the UV-A region having a wavelength of 315 nm or longer and 400 nm or shorter. Alternatively, ultraviolet light having a wavelength of 300 nm or longer and shorter than 315 nm may be used. Still alternatively, a photocurable resin curable by bluish purple to blue visible light having a wavelength of 400 nm or longer and 450 nm or shorter may be used.

A surface of the organic barrier layer 14Dc filling the crack 12Dc and the portion overhung by the particle P couples a surface of the first inorganic barrier layer 12Da on the particles P and a surface of an organic barrier layer 14Db formed on the flat portion of the surface of the OLED 3 to each other continuously and smoothly. Therefore, the second inorganic barrier layer (SiN layer) 16D formed on the first inorganic barrier layer 12Da on the particle P and the organic barrier layer 14D is fine with no defect.

A surface 14Ds of the organic barrier layer 14D has been oxidized by ashing, is hydrophilic, and is highly adhesive to the second inorganic barrier layer 16D.

In order to improve the resistance against bending, it is preferred that the organic barrier layer 14D is ashed so as to be left in substantially the entirety thereof except for the protruding portion of the first inorganic barrier layer 12Da formed on the particle P. It is preferred that the organic barrier layer 14Db present on the flat portion has a thickness of 10 nm or greater.

Patent Documents Nos. 2 and 3 each describe a structure in which the organic barrier layer is located locally. As a result of various experiments performed by the present inventor, it has been found out that the organic barrier layer 14D may be formed on substantially the entirety of the flat portion, more specifically, on substantially the entirety of the flat portion except for the protruding portion of the first inorganic barrier layer 12Da. It is preferred that from the point of the resistance against bending, the thickness of the organic barrier layer 14D is 10 nm or greater.

In the case where the organic barrier layer 14D is provided between the first inorganic barrier layer 12D and the second inorganic barrier layer 16D, the adhesiveness between the layers in the TFE structure 10D is improved. Especially because the surface of the organic barrier layer 14D is oxidized, the organic barrier layer 14D is highly adhesive with the second inorganic barrier layer 16D.

In the case where the organic barrier layer 14Db is formed on the entirety of the flat portion (in the case where the organic barrier layer 14D does not include any opening 14Da), when an external force is applied to the OLED display device, the stress (strain) caused to the inside of the TFE structure 10D is uniformly dispersed. As a result, destruction (especially, destruction of the first inorganic barrier layer 12D and/or the second inorganic barrier layer 16D) is suppressed. The organic barrier layer 14D, which is present substantially uniformly in close contact with the first inorganic barrier layer 12D and the second inorganic barrier layer 16D, is considered to act to disperse and alleviate the stress. As can be seen, the organic barrier layer 14D also provides an effect of improving the resistance against bending of the OLED display device.

It should be noted that in the case where the thickness of the organic barrier layer 14D is 200 nm or greater, the resistance against bending may be decreased. Therefore, it is preferred that the thickness of the organic barrier layer 14D is less than 200 nm.

The organic barrier layer 14D is formed after ashing. Ashing may possibly be varied in the plane. Therefore, a part of the organic barrier layer 14D formed on the flat portion may possibly be removed in the entire thickness thereof to expose the surface of the first inorganic barrier layer 12D. In this case, a portion of the organic barrier layer 14D, more specifically, the organic barrier layer (solid portion) 14Db formed on the flat portion of the OLED 3, is controlled to have a larger area size than that of the opening 14Da. Namely, it is controlled such that the area size of the solid portion 14Db exceeds 50% of the area size of the organic barrier layer (including the opening) 14D on the flat portion. It is preferred that the area size of the solid portion 14Db is 80% or greater of the area size of the organic barrier layer 14D on the flat portion. Nonetheless, it is preferred that the area size of the solid portion 14Db does not exceed about 90% of the area size of the organic barrier layer on the flat portion. In other words, it is preferred that the total area size of the opening 14Da is about 10% of the area size of the organic barrier layer on the flat portion. The opening 14Da provides an effect of suppressing delamination at the interface between the first inorganic barrier layer 12D and the organic barrier layer 14D and at the interface between the organic barrier layer 14D and the second inorganic barrier layer 16D. In the case where the area size of the opening 14Da is 80% or greater and 90% or less of the organic barrier layer 14D on the flat portion, an especially high resistance against bending is provided.

Figure 8B:
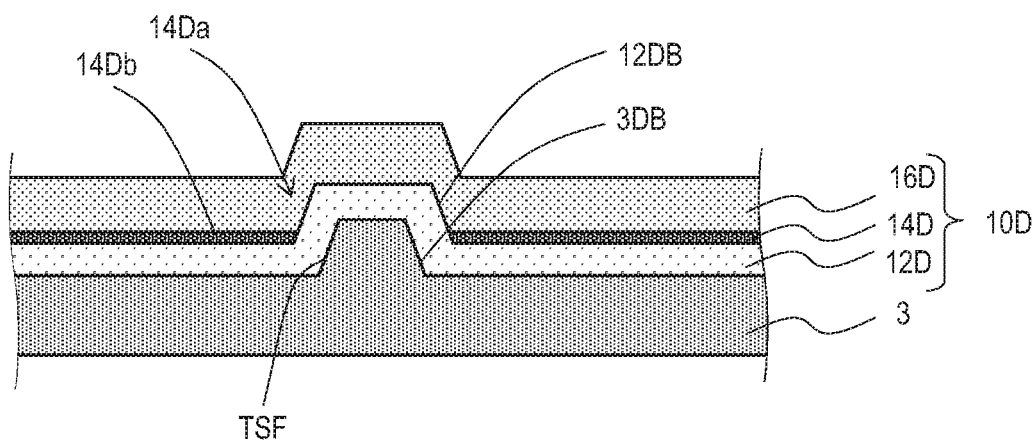

If the organic barrier layer 14D is formed on the entirety of the flat portion, the organic barrier layer 14D on the flat portion acts as a moisture entrance route to decrease the level of moisture-resistance reliability of the OLED display device. In order to avoid this, the OLED display device according to embodiment 2 has a structure shown in FIG. 8(b). An underlying surface for the organic barrier layer 14D (e.g., surface of the OLED 3) includes a bank 3DB substantially enclosing the active region, and the bank 3DB includes a forward tapering side surface portion TSF at least on a lowermost portion of each of two exposed side surfaces thereof. The forward tapering side surface portion TSF has a tapering angle smaller than 90 degrees in a cross-section of the bank 3DB parallel to a width direction thereof. It is preferred that the forward tapering side surface portion TSF has a height (length in a direction normal to the substrate) that is greater than the thickness of the organic material (approximately equal to the thickness of the organic barrier layer 14D), for example, greater than, or equal to, 50 nm, preferably greater than, or equal to, 100 nm.

The first inorganic barrier layer 12D formed on the bank 3DB also includes a bank 12DB. Therefore, on the bank 3DB, an opening 14Da of the organic barrier layer 14D is formed, but no solid portion 14Db is present. Namely, on the bank 3DB, the first inorganic barrier layer 12D and the second inorganic barrier layer 16D are in direct contact with each other to form the inorganic barrier layer joint portion. A portion of the lead wire (having the same structure as that of the lead wire 30A in embodiment 1), more specifically, a portion that is on the bank 3DB, is located to include a forward tapering side surface portion TSF, and no solid portion of the organic barrier layer 14D is present on the bank 3DB. Therefore, in the OLED display device in embodiment 2, the organic barrier layer 14D is provided on the flat portion but the active region is completely enclosed by the inorganic barrier layer joint portion. Therefore, the OLED display device in embodiment 2 has a high level of moisture-resistance reliability.

The bank 3DB may be formed by any of various methods. For example, in a step of forming the circuit 2, a bank defining the pixels including the OLEDs 3 is formed of a photosensitive resin (e.g., polyimide or acrylic resin). In this step, the bank 3DB enclosing the active region R1 may be formed concurrently. Alternatively, in a step of patterning a gate metal layer and/or a source metal layer to form the gate bus lines and/or the source bus lines, a pattern enclosing the active region (pattern for the bank 3DB) may be formed concurrently. In this step, the pattern for the bank 3DB may be formed by use of a multi-gray scale mask shaped in accordance with the opening, so that the pattern includes the forward tapering side surface portion.

With reference to FIG. 11 and FIG. 12, a step of forming the organic barrier layer 14D and the second inorganic barrier layer 16D, especially, the step of ashing, will be described. FIG. 11 shows the step of forming the organic barrier layer 14D, and FIG. 12 shows the step of forming the second inorganic barrier layer 16D.

Figure 11A:
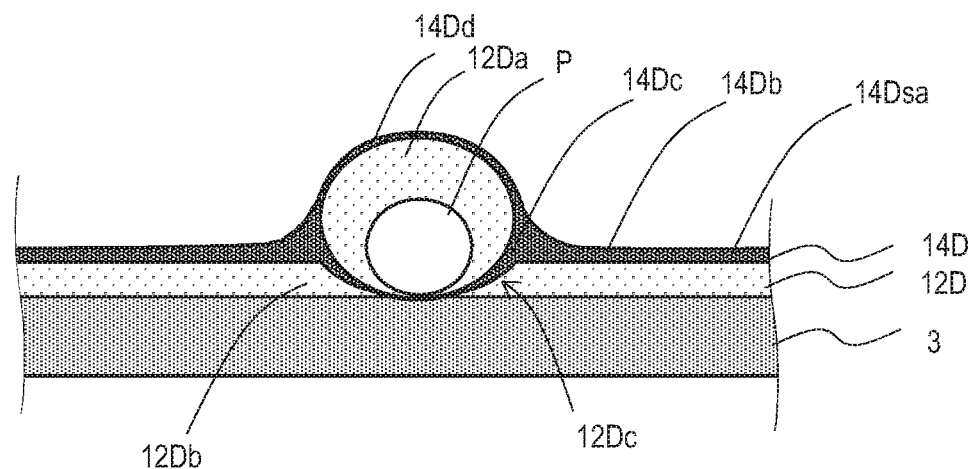
FIG. 11(a) through FIG. 11(c) are schematic cross-sectional views provided to illustrate a step of forming the organic barrier layer 14D.

As schematically shown in FIG. 11(a), the first inorganic barrier layer 12D covering the particle P on the surface of the OLED 3 is formed, and then the organic barrier layer 14D is formed on the first inorganic barrier layer 12D. The organic barrier layer 14D is formed by, for example, condensing a vapor-like or mist-like acrylic monomer on a cooled element substrate and then irradiating the acrylic monomer with light (e.g., ultraviolet light) to cure the acrylic monomer. An acrylic monomer having a low viscosity may be used so as to permeate the crack 12Dc formed in the first inorganic barrier layer 12D.

FIG. 11(a) shows an example in which an organic barrier layer 14Dd is formed on the first inorganic barrier layer 12Da on the particle P. The acrylic monomer may not possibly be deposited (or attached), or may possibly be deposited (or attached) in merely a trace amount, on the first inorganic barrier layer 12Da on the particle P, in the case where the particle P is of a certain size or a certain shape or in the case where the acrylic monomer is of a certain type. The organic barrier layer 14D may be formed by use of, for example, the film formation device 200 shown in FIG. 15 and described below. The organic barrier layer 14D is adjusted to have an initial thickness of 100 nm or greater and 500 nm or less on the flat portion. The organic barrier layer 14D in the initial state thus formed has a surface 14Dsa, which is smoothly continuous and hydrophobic. For the sake of simplicity, the organic barrier layer in a pre-ashing state bears the same reference sign as that of the organic barrier layer in a post-ashing state.

Figure 11B:
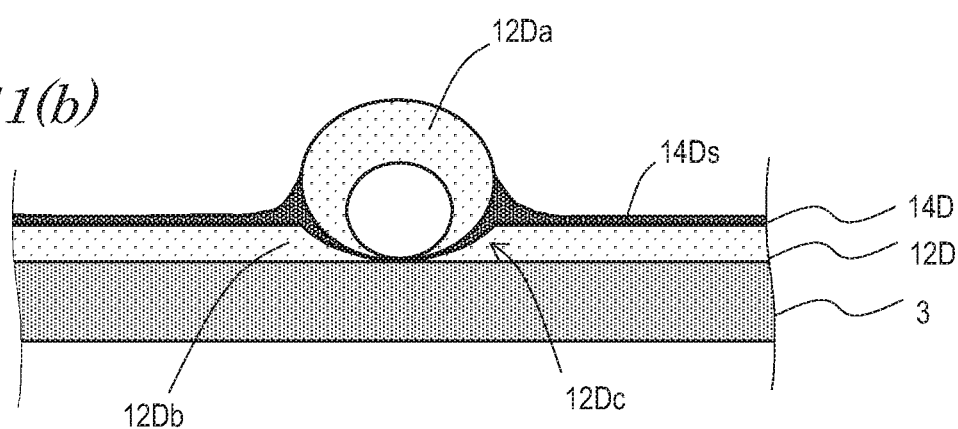

Then, as shown in FIG. 11(b), the organic barrier layer 14D is ashed. The ashing may be performed by use of a known plasma ashing device, a known photoexcitation ashing device, or a known UV ozone ashing device. For example, plasma ashing using at least one type of gas among $N_2O$, $O_2$ and $O_3$, or a combination of such plasma ashing and ultraviolet light irradiation, may be performed. In the case where an SiN film is formed by CVD as each of the first inorganic barrier layer 12D and the second inorganic barrier layer 16D, $N_2O$ is used as a material gas. Therefore, use of $N_2O$ for the ashing provides an advantage that the device is simplified.

In the case where the ashing is performed, the surface 14Ds of the organic barrier layer 14D is oxidized and thus is modified to be hydrophilic. In addition, the surface 14Ds is shaved almost uniformly, and extremely tiny convexed and concaved portions are formed, which increases the surface area size. The effect of increasing the surface area size provided by the ashing is greater for the surface of the organic barrier layer 14D than for the first inorganic barrier layer 12D formed of an inorganic material. Since the surface 14Ds of the organic barrier layer 14D is modified to be hydrophilic and the surface area size of the surface 14Ds is increased, the adhesiveness of the organic barrier layer 14D with the second inorganic barrier layer 16D is improved.

Figure 11C:
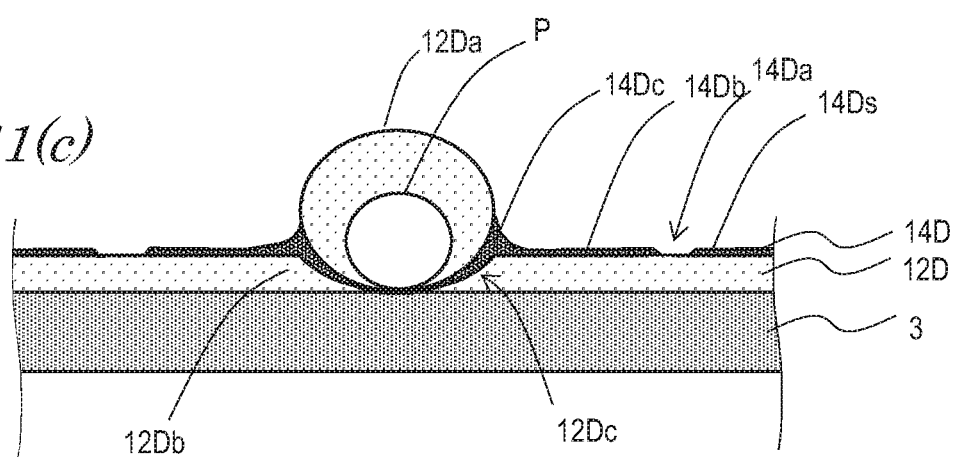

When the ashing is further advanced, an opening 14Da is formed in a part of the organic barrier layer 14D as shown in FIG. 11(c).

When the ashing is still further advanced, the organic barrier layer 14Dc may be left only in the crack 12Dc of the first inorganic barrier layer 12D and in the vicinity of the portion of the first inorganic barrier layer 12D that is overhung by the particle P, like the organic barrier layer 14A shown in FIG. 4(a). In this state, the surface of the organic barrier layer 14Dc couples the surface of the first inorganic barrier layer 12Da on the particle P and the surface of the flat portion of the OLED 3 to each other continuously and smoothly.

In order to improve the adhesiveness between the first inorganic barrier layer 12D and the organic barrier layer 14D, the surface of the first inorganic barrier layer 12D may be ashed before the organic barrier layer 14D is formed.

Now, with reference to FIG. 12, the structure after the second inorganic barrier layer 16D is formed on the organic barrier layer 14D will be described.

Figure 12A:
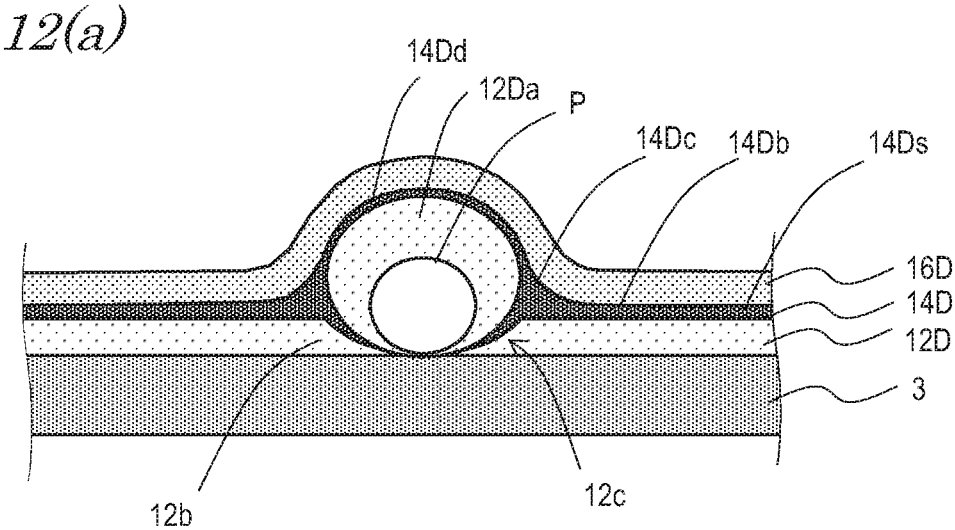
FIG. 12(a) through FIG. 12(c) are schematic cross-sectional views provided to illustrate a step of forming a second inorganic barrier layer 16D.

FIG. 12(a) schematically shows a structure provided as follows: the surface 14Dsa of the organic barrier layer 14D shown in FIG. 11(a) is oxidized by ashing and thus is modified to be a hydrophilic surface 14Ds, and then the second inorganic barrier layer 16D is formed. In this example, the surface 14Dsa of the organic barrier layer 14D is slightly ashed, so that the organic barrier layer 14Dd is left on the first inorganic barrier layer 12Da on the particle P. Alternatively, there may be a case where the organic barrier layer 14D is not formed (or is not left) on the first inorganic barrier layer 12Da on the particle P.

As shown in FIG. 12(a), the second inorganic barrier layer 16D formed on the organic barrier layer 14D has no defect, and is highly adhesive with the organic barrier layer 14D.

Figure 12B:
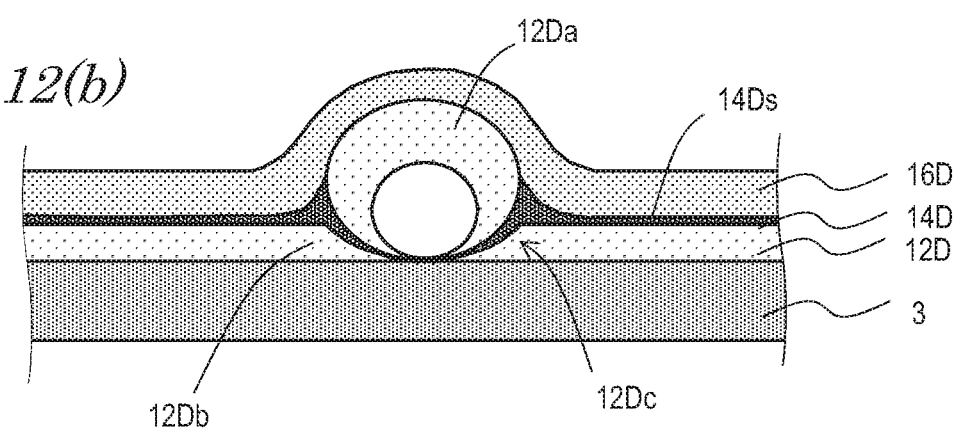
Figure 12C:
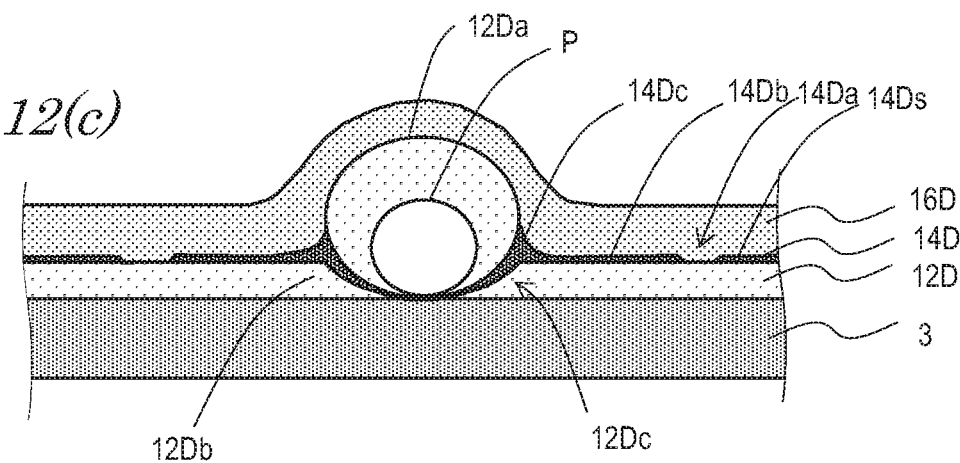

As shown in FIG. 12(b) and FIG. 12(c), the second inorganic barrier layer 16D formed on the organic barrier layer 14D shown in each of FIG. 11(b) and FIG. 11(c) has no defect and is highly adhesive with the organic barrier layer 14D. Even if the organic barrier layer 14D is removed in the entire thickness thereof from the flat portion of the OLED 3, the second inorganic barrier layer 16D has no defect and is highly adhesive with the organic barrier layer 14D as long as the surface of the organic barrier layer 14D couples the surface of the first inorganic barrier layer 12Da on the particle P and the surface of the flat portion of the OLED 3 to each other continuously and smoothly.

As shown in FIG. 12(b), the organic barrier layer 14D may be ashed so as to be left in a small thickness on the entirety of the surface of the first inorganic barrier layer except for the protruding portion of the first inorganic barrier layer 12Da formed on the particle P. From the point of view of the resistance against bending, it is preferred that as described above, the thickness of the organic barrier layer 14Db on the flat portion is 10 mm or greater and less than 200 nm.

Ashing is varied in the plane. Therefore, a part of the organic barrier layer 14D formed on the flat portion may possibly be removed in the entire thickness thereof to expose the surface of the first inorganic barrier layer 12D. The material and the size of the particle P are also varied. Therefore, a portion having a structure shown in FIG. 12(c) or the structure shown in FIG. 4(a) may possibly be present. Even in the case where a part of the organic barrier layer 14D formed on the flat portion is removed in the entire thickness thereof, it is preferred that a portion of the organic barrier layer 14D, more specifically, the organic barrier layer (solid portion) 14Db formed on the flat portion of the OLED 3, is controlled to have a larger area size than that of the opening 14Da. As described above, it is preferred that the area size of the solid portion 14Db is 80% or greater of, but does not exceed about 90% of, the area size of the organic barrier layer 14D on the flat portion.

Figure 13:
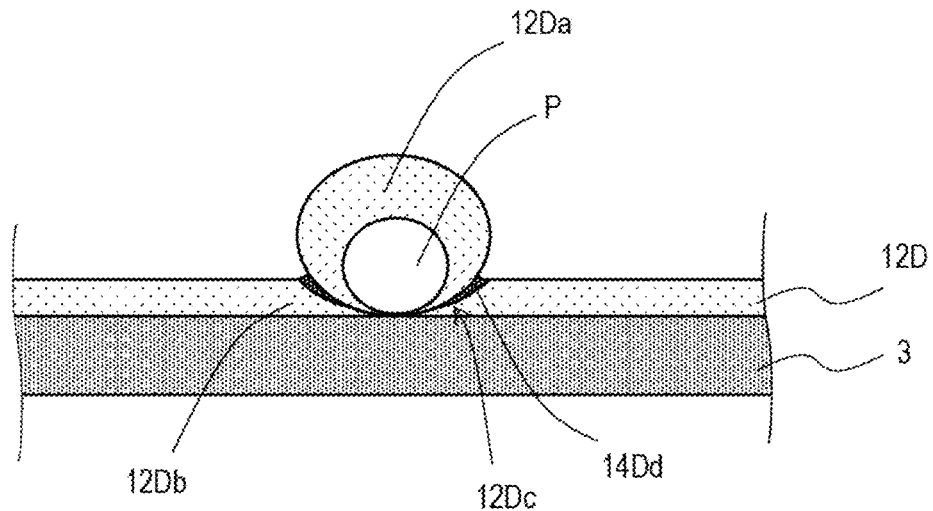
FIG. 13 is a schematic cross-sectional view showing an organic barrier layer 14Dd excessively ashed.
Figure 14:
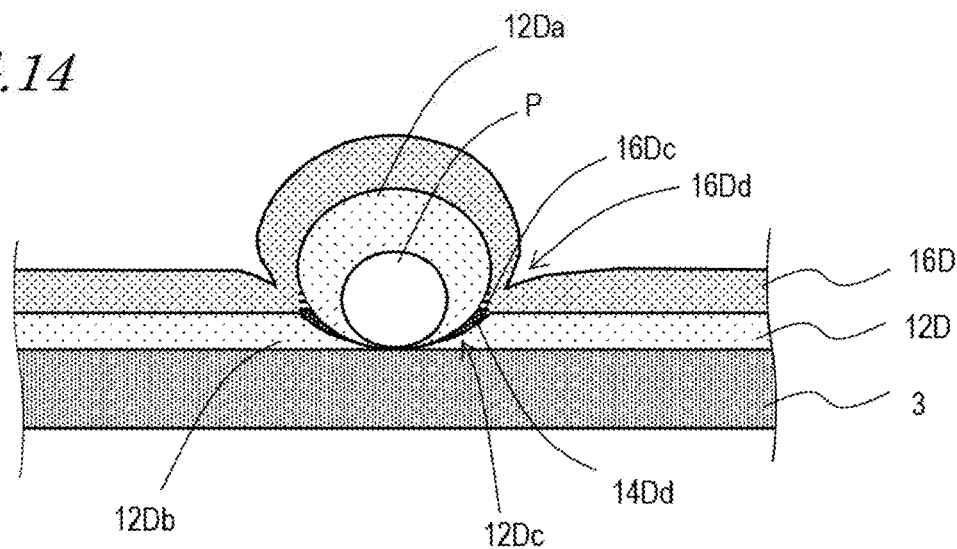
FIG. 14 is a schematic cross-sectional view showing the second inorganic barrier layer 16D formed on the organic barrier layer 14Dd excessively ashed.

Referring to FIG. 13, in the case where the organic barrier layer 14D is ashed excessively, the organic barrier layer 14D formed on the flat portion of the OLED 3 is completely removed, and further the organic barrier layer 14Dd filling the crack 12Dc formed by the particle P is decreased in size and fails to make the surface of the underlying layer for the second inorganic barrier layer 16D continuous and smooth. As a result, as shown in FIG. 14, a defect 16Dc is formed in the second inorganic barrier layer 16D, which decreases the level of barrier property of the TFE structure. Even if the defect 16Dc is not formed, if an acute recessed portion 16Dd is formed at the surface of the second inorganic barrier layer 16D, a stress tends to concentrate at the acute recessed portion 16Dd, which causes a crack to be generated easily by an external force.

In an experiment in which, for example, a silica convex lens (diameter: 4.6 µm) was used as the particle P, there was a case where the organic barrier layer was etched excessively at an end of the silica convex lens, and as a result, the second inorganic barrier layer was made extremely thin partially. In such a case, the second inorganic barrier layer, even if having no defect, may be cracked when an external force is applied to the TFE structure during or after the production of the OLED display device.

An external force may possibly be applied to the TFE structure in the following cases, for example. When the flexible substrate 1 of the OLED display device is peeled off from a glass substrate as a support substrate, a bending stress acts on the OLED display device including the TFE structure 10. A bending stress also acts on the TFE structure when, during the production of a curved-surface display, the OLED display device is bent along a predetermined curved shape. Needless to say, in the case where the flexibility of the OLED display device is utilized while the OLED display device is used (for example, the OLED display device is folded, bent or rolled), various types of stress are applied to the TFE structure 10 during the use of the OLED display device by the user.

In order to avoid this, it is preferred to adjust the ashing conditions such that more than 50% of the organic barrier layer formed on the flat portion of the OLED 3 is left (such that the area size of the organic barrier layer (solid portion) 14Db is larger than the area size of the opening 14Da). It is more preferred that 80% or greater of the organic barrier layer (solid portion) 14Db formed on the flat portion of the OLED 3 is left, and it is still more preferred that about 90% of the organic barrier layer (solid portion) 14Db formed on the flat portion of the OLED 3 is left. Nonetheless, it is preferred that the opening 14Da occupies about 10% of the organic barrier layer 14D because the opening 14Da having such an area size provides an effect of suppressing delamination at the interface between the first inorganic barrier layer 12D and the organic barrier layer 14D and at the interface between the organic barrier layer 14D and the second inorganic barrier layer 16D. As shown in FIG. 12(a) through FIG. 12(c), the surface of the second inorganic barrier layer 16D formed on the organic barrier layer 14D left in an appropriate amount does not include any portion having an angle of 90 degrees or lower (see the recessed portion 16Dd in FIG. 14). Therefore, even if an external force is applied, concentration of the stress is suppressed.

The method for producing the OLED display device according to embodiment 2 of the present invention includes the steps of preparing, in a chamber, the OLED 3 having the first inorganic barrier layer 12D formed thereon; supplying a vapor-like or mist-like photocurable resin (e.g., acrylic monomer) into the chamber; condensing the photocurable resin on the first inorganic barrier layer 12D to form a liquid-like film; irradiating the liquid-like film of the photocurable resin with light to form a photocured resin layer (cured resin layer); and partially ashing the photocured resin layer to form the organic barrier layer 14D.

Since an ultraviolet-curable resin is preferably used as the photocurable resin, an example in which the ultraviolet-curable resin is used will be described below. The method is also applicable to a visible light-curable resin as long as a light source that emits light having a predetermined wavelength capable of curing the photocurable resin is used.

Figure 15:
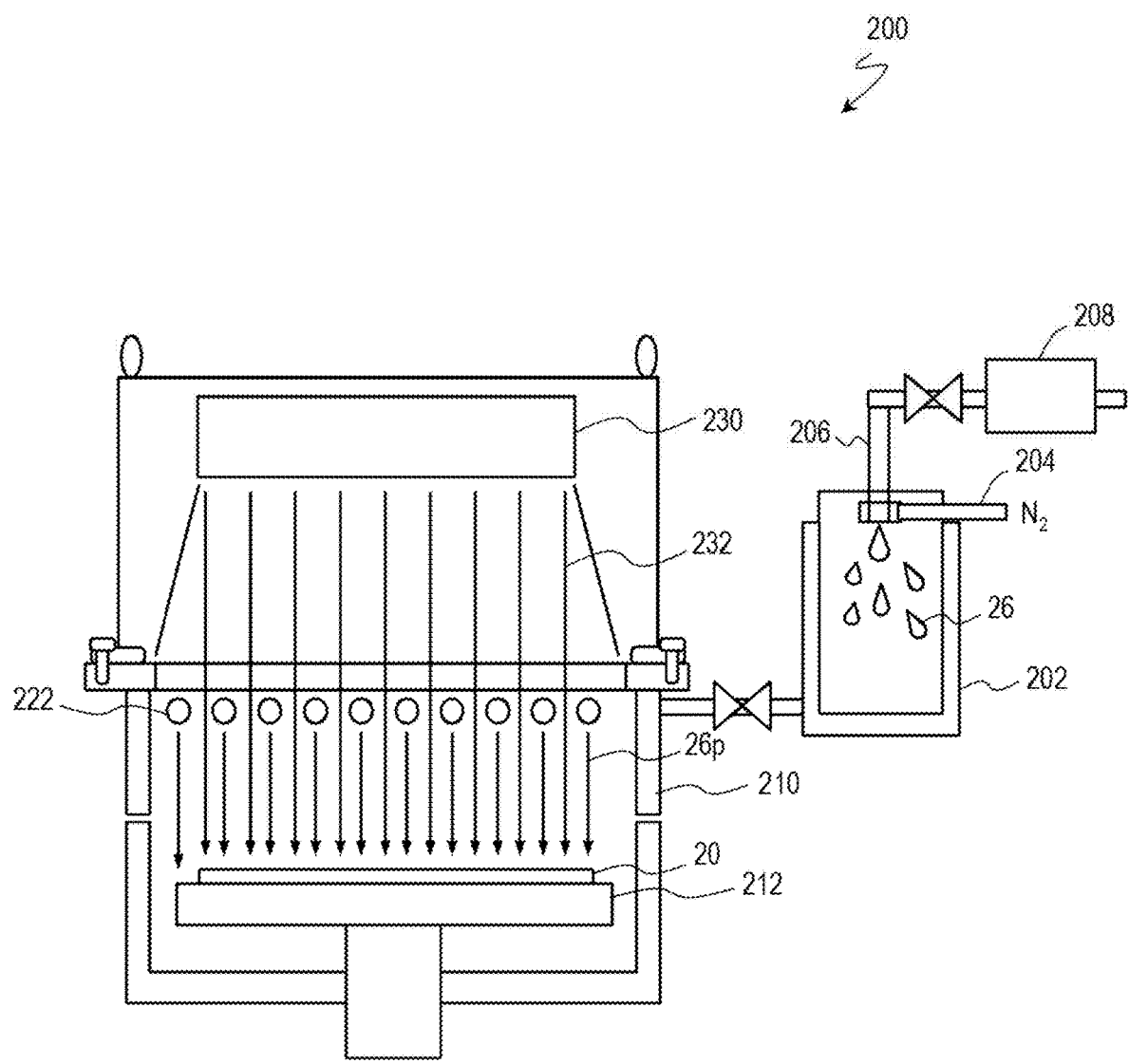
FIG. 15 is a schematic view showing a structure of a film formation device 200 usable to form an organic barrier layer 14.

FIG. 15 shows a structure of film formation device 200 usable to form an organic barrier layer 14D.

The film formation device 200 includes a chamber 210, a stage 212, monomer supply openings (nozzles) 222, and an ultraviolet irradiation device 230. An inner space of the chamber 210 is controlled to have a predetermined pressure (vacuum degree) and a predetermined temperature. The stage 212 has a top surface that receives an element substrate 20 including a plurality of the OLEDs 3, on which the first inorganic barrier layer is formed. The top surface may be cooled down to, for example, −20° C. The nozzles 222 supply the acrylic monomer (liquid-like) supplied at a predetermined flow rate to the space in the chamber 210 in a vapor-like or mist-like state. When necessary, the acrylic monomer is heated. A vapor-like or mist-like acrylic monomer 26p is attached to, or contacts, the first inorganic barrier layer on the element substrate 20. The ultraviolet irradiation device 230 emits ultraviolet light 232 having a predetermined wavelength and a predetermined intensity toward the top surface of the stage 212.

An acrylic monomer 26 is supplied from a container 202 into the chamber 210 at a predetermined flow rate. The container 202 is supplied with the acrylic monomer 26 via a pipe 206 and also is supplied with nitrogen gas from a pipe 204. The flow rate of the acrylic monomer supplied to the container 202 is controlled by a mass flow controller 208.

The film formation device 200 may be used to form the organic barrier layer 14 as follows, for example. The following example is one of typical examples of conditions used to form a prototype of the TFE structure 10 or to form a sample shown in the SEM image.

The acrylic monomer 26p is supplied into the chamber 210. The element substrate 20 has been cooled to, for example, −15° C. on the stage 212. The acrylic monomer 26p is condensed on the first inorganic barrier layer 12 on the element substrate to become a liquid-like film. The supply amount of the acrylic monomer 26p and the temperature and the pressure (vacuum degree) of the chamber 210 may be controlled to adjust the deposition rate of the acrylic monomer (liquid-like). For example, the acrylic monomer may be deposited at 500 nm/min. Therefore, an acrylic monomer layer having a thickness of about 200 nm may be formed within about 24 seconds.

The conditions in the above-described process may be controlled to locate the acrylic monomer locally, more specifically, only in the vicinity of the protruding portion, like in the method for forming the organic barrier layer described in embodiment 1.

As the acrylic monomer, any of various known acrylic monomers is usable. A plurality of acrylic monomers may be mixed together. For example, a two-functional monomer and a monomer including three or more functional groups may be mixed together. An oligomer may be mixed. It is preferred that the acrylic monomer has a viscosity at room temperature (e.g., 25° C.) adjusted to about 1 to 100 mPa·s. A photoinitiator may be incorporated into the acrylic monomer when necessary.

Then, the gas in the chamber 210 is discharged to remove the vapor-like or mist-like acrylic monomer 26p. After that, the acrylic monomer on the first inorganic barrier layer 12D is irradiated with the ultraviolet light 232 to be cured. As a source of the ultraviolet light, a high pressure mercury lamp that provides light having a main peak at 365 nm is used. The ultraviolet light is directed at an intensity of, for example, 12 mW/cm$^2$ for about 10 seconds.

As can be seen, the tact time of the step of forming the organic barrier layer 14D is about 34 seconds. Thus, the mass-productivity is very high.

The first inorganic barrier layer 12D is formed, for example, as follows. The first inorganic barrier layer 12D having a thickness of 400 nm may be formed by plasma CVD using $SiH_4$ gas and $N_2O$ gas, at a film formation rate of 400 nm/min, in a state where, for example, the temperature of the substrate (the OLED 3) on which the film is to be formed is controlled to be lower than, or equal to, 80° C. The first inorganic barrier layer 12D thus formed has a refractive index of 1.84 and a 400 nm visible light transmittance of 90% (thickness: 400 nm). The first inorganic barrier layer 12D has a film stress having an absolute value of 50 MPa.

Ashing to form the organic barrier layer 14D is, for example, plasma ashing performed using $N_2O$ gas. The ashing is performed in an ashing chamber. The ashing is performed at an ashing rate of, for example, 500 nm/min. In the case where the organic barrier layer 14D having a thickness of 200 nm is formed as described above, ashing is performed for about 22 seconds such that the organic barrier layer (solid portion) 14Db on the flat portion has a thickness (maximum value) of about 20 nm.

The conditions in the above-described process may be adjusted to form the organic barrier layer 14A shown in FIG. 3(a) and FIG. 3(b). A portion of the organic barrier layer 14D that is on the lead wire is thinner than the other portion of the organic barrier layer 14D. Therefore, the portion of the organic barrier layer 14D that is on the lead wire may be removed to leave more than 50% of the area size of the organic barrier layer 14D on the flat portion.

After the ashing, the $N_2O$ gas is removed, and the organic barrier layer 14D is transported to a CVD chamber in which the second inorganic barrier layer 16D is to be formed. The second inorganic barrier layer 16D is formed under, for example, the same conditions as those used to form the first inorganic barrier layer 12D.

In this manner, the TFE structure 10D and the OLED display device including the TFE structure 10D may be produced. The method for producing the OLED display device according to embodiment 2 of the present invention is to once form an organic barrier layer having a sufficient thickness and then ash the organic barrier layer to form an organic barrier layer having a desired thickness. Since it is not needed to locate the resin material locally, unlike in the method described in Patent Document No. 2 or 3, the method according to embodiment 2 provides a large process margin and has a high mass productivity.

As described above, the surface of the organic barrier layer 14D is oxidized. Therefore, the organic barrier layer 14D is highly adhesive with the first inorganic barrier layer 12D and the second inorganic barrier layer 16D, and has a high level of moisture-resistance reliability. The WVTR of, for example, the TFE structure 10D shown above specifically as an example (including a polyimide film having a thickness of 15 μm instead of the OLED 3 shown in FIG. 8) was evaluated and found to be less than $1 \times 10^{-4}$ g/m$^2$/day as converted into the value at room temperature. This value is the lower limit of measurement.

A structure in which the organic barrier layer 14D is present at substantially the entirety of the interface between the first inorganic barrier layer 12D and the second inorganic barrier layer 16D on the flat portion has a high resistance against bending.

As the inorganic barrier layer, an SiO layer, an SiON layer, an SiNO layer, an $Al_2O_3$ layer or the like may be used instead of the SiN layer. As the resin forming the organic barrier layer, a photocurable resin such as a vinyl group-containing monomer or the like may be used instead of the acrylic resin. An ultraviolet-curable silicone resin may be used as the photocurable resin. A silicone resin (encompassing silicone rubber) is superb in the visible light transmittance and the climate resistance, and has a feature of not being easily yellowed even after being used for a long time. A photocurable resin curable by being irradiated with visible light may be used. The viscosity of the photocurable resin, used in an embodiment of the present invention, in a pre-cured state at room temperature (e.g., 25° C.) preferably does not exceed 10 Pa·s, and especially preferably is 1 to 100 mPa·s as described above.

INDUSTRIAL APPLICABILITY

An embodiment of the present invention is applicable to an organic EL display device, specifically, a flexible organic EL display device, and a method for producing the same.

REFERENCE SIGNS LIST 1 flexible substrate
2 backplane (circuit)
3 organic EL display device
4 polarizing plate
10, 10A, 10B, 10C, 10D thin film encapsulation structure (TFE structure)
12, 12A, 12B, 12C, 12D first inorganic barrier layer (SiN layer)
14, 14A, 14B, 14D organic barrier layer (acrylic resin layer)
14Da opening of the organic barrier layer
14Db solid portion of the organic barrier layer
14Ds surface of the organic barrier layer (post-ashing)
14Dsa surface of the organic barrier layer (pre-ashing)
16, 16A, 16B, 16C, 16D second inorganic barrier layer (SiN layer)
16Dc defect
16Dd recessed portion
20 element substrate
26 acrylic monomer
26$p$ vapor-like or mist like acrylic monomer
100, 100A organic EL display device

The invention claimed is:

1. An organic electroluminescent display device, comprising:
   a substrate;
   a plurality of TFTs formed on the substrate;
   a plurality of gate bus lines and a plurality of source bus lines each connected with any of the plurality of TFTs;
   a plurality of organic electroluminescent elements each connected with any of the plurality of TFTs;
   a plurality of terminals located in a peripheral region outer to an active region in which the plurality of organic electroluminescent elements are located;
   a plurality of lead wires each connecting either one of the plurality of terminals and either one of the plurality of gate bus lines or either one of the plurality of source bus lines; and
   a thin film encapsulation structure formed on the plurality of organic electroluminescent elements and on portions of the plurality of lead wires, the portions being closer to the active region,
   wherein the thin film encapsulation structure includes a first inorganic barrier layer, an organic barrier layer in contact with the first inorganic barrier layer, and a second inorganic barrier layer in contact with the organic barrier layer,
   wherein at least a portion of each of the plurality of lead wires includes, at least on a lowermost portion of each of two side surfaces thereof in contact with the first inorganic barrier layer, a forward tapering side surface portion having a tapering angle smaller than 90 degrees in a cross-section parallel to a line width direction thereof;
   wherein the thin film encapsulation structure includes an inorganic barrier layer joint portion in which the organic barrier layer is not present, and the first inorganic barrier layer and the second inorganic barrier layer are in direct contact with each other, and
   wherein on the portion of each of the plurality of lead wires that includes the forward tapering side surface portion, the inorganic barrier layer joint portion is formed and the active region is completely enclosed by the inorganic barrier layer joint portion.

2. The organic electroluminescent display device of claim 1, wherein the plurality of terminals each include a forward tapering side surface portion having a tapering angle smaller than 90 degrees at least on a lowermost portion of each of all exposed side surfaces thereof.

3. The organic electroluminescent display device of claim 1, wherein the forward tapering side surface portion has a tapering angle smaller than, or equal to, 85 degrees.

4. The organic electroluminescent display device of claim 1, wherein the forward tapering side surface portion has a length longer than, or equal to, 50 nm in a direction normal to the substrate.

5. The organic electroluminescent display device of claim 1, wherein the portion of each of the plurality of lead wires on which the organic barrier layer is not present and the first inorganic barrier layer and the second inorganic barrier layer are in direct contact with each other has a length of at least 0.01 mm.

6. The organic electroluminescent display device of claim 1, wherein the plurality of gate bus lines and the plurality of source bus lines each have side surfaces each having a tapering angle exceeding 85 degrees in a cross-section parallel to a line width direction thereof.

7. The organic electroluminescent display device of claim 1, wherein the organic barrier layer is not substantially present on a flat portion.

8. The organic electroluminescent display device of claim 1, wherein the organic barrier layer includes an opening on a flat portion, and a portion of the organic barrier layer that is present on the flat portion has an area size larger than an area size of the opening.

9. The organic electroluminescent display device of claim 8,
   wherein an underlying surface for the organic barrier layer includes a bank substantially enclosing the active region,
   wherein the bank includes, at least on a lowermost portion of each of two side surfaces thereof in contact with the first inorganic barrier layer, a forward tapering side surface portion having a tapering angle smaller than 90 degrees in a cross-section parallel to a line width direction thereof,
   wherein a portion of each of the lead wires that is on the bank includes the forward tapering side surface portion, and
   wherein on the bank, the organic barrier layer is not present and the first inorganic barrier layer and the second inorganic barrier layer are in direct contact with each other.

10. A method for producing an organic electroluminescent display device of claim 1, the method comprising:

step A of forming the first inorganic barrier layer selectively on the active region of the substrate, the plurality of organic electroluminescent elements being formed in the active region;

a step, after the step A, of locating the substrate in a chamber and supplying a vapor-like or mist-like photocurable resin into the chamber;

step B of condensing the photocurable resin on the first inorganic barrier layer such that the photocurable resin is not present on the portion of each of the lead wires that includes the forward tapering side surface portion; and a step, after the step B, of irradiating the condensed photocurable resin with light to form the organic barrier layer of a photocured resin.

11. A method for producing an organic electroluminescent display device of claim 1, the method comprising:

step A of forming the first inorganic barrier layer selectively on the active region of the substrate, the plurality of organic electroluminescent elements being formed in the active region;

a step, after the step A, of locating the substrate in a chamber and supplying a vapor-like or mist-like photocurable resin into the chamber;

a step of condensing the photocurable resin on the first inorganic barrier layer to form a liquid-like film;

a step of irradiating the liquid-like film of the photocurable resin with light to form a photocured resin layer; and a step of partially ashing the photocured resin layer to form the organic barrier layer.

12. The method for producing an organic electroluminescent display device of claim 10, further comprising a step of forming the plurality of gate bus lines, the plurality of source bus lines, the plurality of lead wires, and the plurality of terminals by a dry etching process.

13. The method for producing an organic electroluminescent display device of claim 10, wherein the step of forming the plurality of lead wires includes a step of forming the portion including the forward tapering side surface portion by a photolithography step using a multi-gray scale mask.

14. The method for producing an organic electroluminescent display device of claim 10, wherein the photocurable resin contains an acrylic monomer.

15. The method for producing an organic electroluminescent display device of claim 11, further comprising a step of forming the plurality of gate bus lines, the plurality of source bus lines, the plurality of lead wires, and the plurality of terminals by a dry etching process.

16. The method for producing an organic electroluminescent display device of claim 11, wherein the step of forming the plurality of lead wires includes a step of forming the portion including the forward tapering side surface portion by a photolithography step using a multi-gray scale mask.

17. The method for producing an organic electroluminescent display device of claim 11, wherein the photocurable resin contains an acrylic monomer.

* * * * *